United States Patent
Sun et al.

(10) Patent No.: US 11,444,362 B2
(45) Date of Patent: Sep. 13, 2022

(54) SIGNAL PROCESSING CIRCUIT, RADIO FREQUENCY SIGNAL TRANSMITTER, AND COMMUNICATIONS DEVICE

(71) Applicant: HUAWEI TECHNOLOGIES CO., LTD., Guangdong (CN)

(72) Inventors: Jie Sun, Shanghai (CN); Yan Gao, Shanghai (CN); Zhixiong Zeng, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 59 days.

(21) Appl. No.: 16/908,321

(22) Filed: Jun. 22, 2020

(65) Prior Publication Data
US 2020/0321673 A1 Oct. 8, 2020

Related U.S. Application Data

(63) Continuation of application No. PCT/CN2017/118071, filed on Dec. 22, 2017.

(51) Int. Cl.
*H01P 1/38* (2006.01)
*H01P 5/22* (2006.01)
(Continued)

(52) U.S. Cl.
CPC ............ *H01P 1/38* (2013.01); *H01P 5/22* (2013.01); *H03F 1/0288* (2013.01); *H03F 3/245* (2013.01);
(Continued)

(58) Field of Classification Search
CPC . H01P 1/38; H01P 5/22; H03F 1/0288; H03F 3/245; H03F 2200/102; H03F 2200/451; H04B 1/04
(Continued)

(56) References Cited

U.S. PATENT DOCUMENTS 6,054,894 A * 4/2000 Wright ................. H03F 1/0294
330/124 R
6,894,562 B2 5/2005 Nakayama et al.
(Continued)

FOREIGN PATENT DOCUMENTS

CN  101640562 A  2/2010
CN  101675584 A  3/2010
(Continued)

OTHER PUBLICATIONS

Office Action issued in Chinese Application No. 201780097831.7 dated Dec. 11, 2020, 6 pages.
(Continued)

*Primary Examiner* — Hafizur Rahman
(74) *Attorney, Agent, or Firm* — Fish & Richardson P.C.

(57) ABSTRACT

Embodiments of this application disclose a signal processing circuit, a radio frequency signal transmitter, and a communications device, and relate to the field of electronic device technologies, to improve power amplification efficiency of the signal processing circuit. The signal processing circuit includes: a splitter, a radio frequency signal converter, a first branch power amplifier, a second branch power amplifier, and a combiner. The splitter is connected to the radio frequency signal converter, the radio frequency signal converter is connected to the first branch power amplifier and the second branch power amplifier, and the first branch power amplifier and the second branch power amplifier are connected to the combiner.

14 Claims, 17 Drawing Sheets

(51) Int. Cl.
*H03F 1/02* (2006.01)
*H03F 3/24* (2006.01)
*H04B 1/04* (2006.01)

(52) U.S. Cl.
CPC ......... *H04B 1/04* (2013.01); *H03F 2200/102* (2013.01); *H03F 2200/451* (2013.01)

(58) Field of Classification Search
USPC .......................................................... 330/295
See application file for complete search history.

(56) References Cited

U.S. PATENT DOCUMENTS

| | | |
|---|---|---|
| 2005/0134377 A1 | 6/2005 | Dent |
| 2012/0294387 A1 | 11/2012 | Ghannouchi et al. |
| 2014/0028391 A1* | 1/2014 | Morris .................... H03F 3/189 330/147 |
| 2014/0118063 A1 | 5/2014 | Briffa et al. |
| 2017/0133990 A1* | 5/2017 | Jang ...................... H03F 1/0294 |

FOREIGN PATENT DOCUMENTS

| | | |
|---|---|---|
| CN | 103518331 A | 1/2014 |
| CN | 104704747 A | 6/2015 |
| CN | 105375883 A | 3/2016 |
| CN | 106374863 A | 2/2017 |
| CN | 106452370 A | 2/2017 |
| CN | 106506014 A | 3/2017 |
| KR | 20110033383 A | 3/2011 |
| WO | 2008119164 A1 | 10/2008 |

OTHER PUBLICATIONS

PCT International Search Report and Written Opinion issued in International Application No. PCT/CN2017/118071 dated Sep. 6, 2018, 17 pages (with English translation).

Extended European Search Report issued in European Application No. 17935244.8 dated Nov. 17, 2020, 8 pages.

* cited by examiner

SIGNAL PROCESSING CIRCUIT, RADIO FREQUENCY SIGNAL TRANSMITTER, AND COMMUNICATIONS DEVICE

CROSS-REFERENCE TO RELATED APPLICATIONS

This application is a continuation of International Application No. PCT/CN2017/118071, filed on Dec. 22, 2017, the disclosure of which is hereby incorporated by reference in its entirety.

BACKGROUND

Currently, in a modern digital communication standard, a peak-to-average ratio of a signal is quite high, and is usually greater than 8 dB, or may even be greater than 10 dB. Therefore, a power amplifier (PA) of a radio frequency signal transmitter needs to work in a high-power back-off state. For a conventional class-AB power amplifier, efficiency of the conventional class-AB power amplifier decreases rapidly in power back-off. A conventional two-way Doherty amplifier can maintain relatively high efficiency when power back-off range is below 6 dB, and a two-way ADoherty (asymmetric Doherty) technology can be used to implement high efficiency work in power back-off beyond 6 dB. However, there is an obvious "efficiency depression area" on an efficiency curve in a power back-off range. A larger power back-off range indicates a larger depression in the "efficiency depression area", and indicates lower work efficiency of a corresponding power amplifier.

As shown in FIG. 1, the prior art provides a load-pull technology at an isolated port. A power divider 3 splits a radio frequency input signal received through a power amplifier input port 1 into two signals. One output port of the power divider 3 is connected to a main power amplifier 4, and another output port is connected to an auxiliary power amplifier 5. The auxiliary power amplifier 5 works only when the power divider 3 has a high-level output signal. An output signal of the auxiliary power amplifier 5 is injected into an output port of the main power amplifier 4 by using a circulator 6, and an output signal of the main power amplifier 4 is injected into an output port 2 by using the circulator 6. In a prior-art solution, a main power amplifier is a class-AB power amplifier, and an auxiliary power amplifier is a class-C power amplifier. Although theoretically, high efficiency can be obtained in high power back-off, the main power amplifier needs to work in a case of a large load-pull ratio. In this case, efficiency of the main power amplifier sharply decreases, resulting in quite low overall efficiency of the power amplifier. In the prior-art solution, one power amplifier input port 1 is used, a radio frequency input signal is split into two signals by using the power divider 3, and the two signals are input to the main power amplifier and the auxiliary power amplifier. Adjustment of a phase and an amplitude of the two signals input to the main power amplifier and the auxiliary power amplifier is limited, and the auxiliary power amplifier has a limited load-pull effect on the main power amplifier. Consequently, an amount of power back-off is small, and power amplification efficiency is low.

SUMMARY

Embodiments of this application provide a signal processing circuit, a radio frequency signal transmitter, and a communications device, to improve power amplification efficiency of the signal processing circuit.

To achieve the foregoing objective, the following technical solutions are used in the embodiments of this application.

According to a first aspect, a signal processing circuit is provided. The signal processing circuit includes: a splitter module, a radio frequency signal conversion module, a first branch power amplifier, a second branch power amplifier, and a combiner module. The splitter module is connected to the radio frequency signal conversion module, the radio frequency signal conversion module is connected to the first branch power amplifier and the second branch power amplifier, and the first branch power amplifier and the second branch power amplifier are connected to the combiner module. The splitter module is configured to: receive a first digital signal, split the first digital signal into at least one first branch digital signal and at least one second branch digital signal based on an input power of the first digital signal, and output the at least one first branch digital signal and the at least one second branch digital signal to the radio frequency signal conversion module, where a ratio of an amplitude of the at least one first branch digital signal to an amplitude of the at least one second branch digital signal varies with the input power of the first digital signal, and/or a phase difference between the at least one first branch digital signal and the at least one second branch digital signal varies with the input power of the first digital signal. The radio frequency signal conversion module is configured to: convert the at least one first branch digital signal and the at least one second branch digital signal into at least one first branch radio frequency signal and at least one second branch radio frequency signal, and output the at least one first branch radio frequency signal and the at least one second branch radio frequency signal. The first branch power amplifier is configured to: amplify the received at least one first branch radio frequency signal, and output the amplified at least one first branch radio frequency signal to the combiner module. The second branch power amplifier is configured to: amplify the received at least one second branch radio frequency signal, and output the amplified at least one second branch radio frequency signal to the combiner module. The combiner module is configured to: receive at least one output signal output by the first branch power amplifier and at least one output signal output by the second branch power amplifier; and adjust, based on the at least one output signal output by the second branch power amplifier, the at least one output signal output by the first branch power amplifier, and output the adjusted at least one output signal.

In this way, because the splitter module can split the first digital signal into the at least one first branch digital signal and the at least one second branch digital signal based on the input power of the first digital signal, and the radio frequency signal conversion module can convert the at least one first branch digital signal and the at least one second branch digital signal into the at least one first branch radio frequency signal and the at least one second branch radio frequency signal, and output the at least one first branch radio frequency signal and the at least one second branch radio frequency signal, where the ratio of the amplitude of the at least one first branch digital signal to the amplitude of the at least one second branch digital signal varies with the input power of the first digital signal, and/or the phase difference between the at least one first branch digital signal and the at least one second branch digital signal varies with the input power of the first digital signal, the at least one first branch radio frequency signal entering the first branch power amplifier and the at least one second branch radio frequency signal entering the second branch power amplifier are adjusted independently from each other. In this way, a phase and an amplitude of each radio frequency signal received by the two branch power amplifiers can be adjusted, to maximize output efficiency of the signal processing circuit. In other words, in the solution of this application, signals in the two branch power amplifiers are more flexibly adjusted. Therefore, power amplification efficiency of the signal processing circuit is further improved. In addition, the splitter module splits the first digital signal, to accurately adjust an amplitude and/or a phase of the signal, so that the radio frequency signals that enter the two branch power amplifiers are more accurately adjusted, to more accurately match work areas of the power amplifiers, and further improve work efficiency of the power amplifiers.

In an example solution, the first branch power amplifier includes a first signal splitter and at least two first power sub-amplifiers connected to the first signal splitter. The first signal splitter has an input port connected to the radio frequency signal conversion module, and receives one first branch radio frequency signal, where at least two output ports of the first signal splitter each are connected to one first power sub-amplifier. The first signal splitter is configured to: split the first branch radio frequency signal into at least two radio frequency signals, and output the at least two radio frequency signals.

In an example solution, the second branch power amplifier includes a second signal splitter and at least two second power sub-amplifiers connected to the second signal splitter. The second signal splitter has an input port connected to the radio frequency signal conversion module, and receives one second branch radio frequency signal, where at least two output ports of the second signal splitter each are connected to one second power sub-amplifier. The second signal splitter is configured to: split the second branch radio frequency signal into at least two radio frequency signals, and output the at least two radio frequency signals.

In an example solution, the first branch power amplifier includes at least one first power sub-amplifier; and any first power sub-amplifier in the at least one first power sub-amplifier has an input port connected to the radio frequency signal conversion module, and receives one first branch radio frequency signal.

In an example solution, the second branch power amplifier includes at least one second power sub-amplifier; and any second power sub-amplifier in the at least one second power sub-amplifier has an input port connected to the radio frequency signal conversion module, and receives one second branch radio frequency signal.

In an example solution, the combiner module includes a three-port device; the first branch power amplifier includes one output port; and the second branch power amplifier includes one output port. A first port of the three-port device is connected to the output port of the first branch power amplifier, and the first branch power amplifier is specifically configured to: amplify the received at least one first branch radio frequency signal, and output the amplified at least one first branch radio frequency signal to the first port of the three-port device. A third port of the three-port device is connected to the output port of the second branch power amplifier, and the second branch power amplifier is specifically configured to: amplify the received at least one second branch radio frequency signal, and output the amplified at least one second branch radio frequency signal to the third port of the three-port device. The three-port device is configured to: adjust, based on the signal received through the third port, the signal received through the first port, and output the signal through a second port of the three-port device.

The three-port device includes a circulator. Alternatively, the three-port device includes a first isolator and a second isolator. An input port of the first isolator is connected to the first port of the three-port device, and an output port of the first isolator is connected to the second port of the three-port device. An input port of the second isolator is connected to the third port of the three-port device, and an output port of the second isolator is connected to the first port of the three-port device. The second isolator is configured to transmit the signal received through the third port of the three-port device to the input port of the first isolator. The first isolator is configured to adjust, based on the signal received through the third port of the three-port device, the signal received through the first port of the three-port device, and output the signal through the second port of the three-port device.

In an example solution, the combiner module includes a four-port device; the first branch power amplifier includes a first output port and a second output port; and the second branch power amplifier includes one output port. The first output port of the first branch power amplifier is connected to a first port of the four-port device; the second output port of the first branch power amplifier is connected to a second port of the four-port device; and the output port of the second branch power amplifier is connected to a third port of the four-port device. The first branch power amplifier is specifically configured to: receive at least two first branch radio frequency signals; and amplify the received at least two first branch radio frequency signals, and separately output the at least two amplified first branch radio frequency signals to the first port and the second port of the four-port device.

The second branch power amplifier is specifically configured to: amplify the received at least one second branch radio frequency signal, and output the amplified at least one second branch radio frequency signal to the third port of the four-port device. The four-port device is configured to: adjust, based on the signal received through the third port, the signal received through the first port and the signal received through the second port; and combine the adjusted signal received through the first port and the adjusted signal received through the second port, and output a combined signal to a fourth port of the four-port device.

The four-port device includes at least one of a rat-race coupler and a hybrid coupler.

In an example solution, the first branch power amplifier includes at least one of the following power amplifier types: a single-tube power amplifier, a Doherty power amplifier, a Chireix power amplifier, an outphasing power amplifier, and an envelope tracking ET power amplifier.

In an example solution, the second branch power amplifier includes at least one of the following power amplifier types: a single-tube power amplifier, a Doherty power amplifier, a Chireix power amplifier, an outphasing power amplifier, and an ET power amplifier.

In an example solution, the first branch power amplifier includes the Doherty power amplifier, and/or the second branch power amplifier includes the Doherty power amplifier. That the first branch power amplifier uses the Doherty power amplifier can further reduce a load-pull ratio of the first branch power amplifier in power back-off, and can further improve work efficiency of the first branch power amplifier in the power back-off, thereby improving work efficiency of the signal processing circuit in the power back-off. That the second branch power amplifier uses the Doherty power amplifier can further improve work efficiency of the signal processing circuit in high power back-off.

According to a second aspect, a radio frequency signal transmitter is provided, and includes the signal processing circuit in any one of the foregoing example solutions.

According to a third aspect, a communications device is provided, and includes the foregoing radio frequency signal transmitter.

BRIEF DESCRIPTION OF DRAWINGS

To describe the technical solutions in the embodiments of this application or in the prior art more clearly, the following briefly describes the accompanying drawings required for describing the embodiments or the prior art.

DESCRIPTION OF EMBODIMENTS

Figure 1:
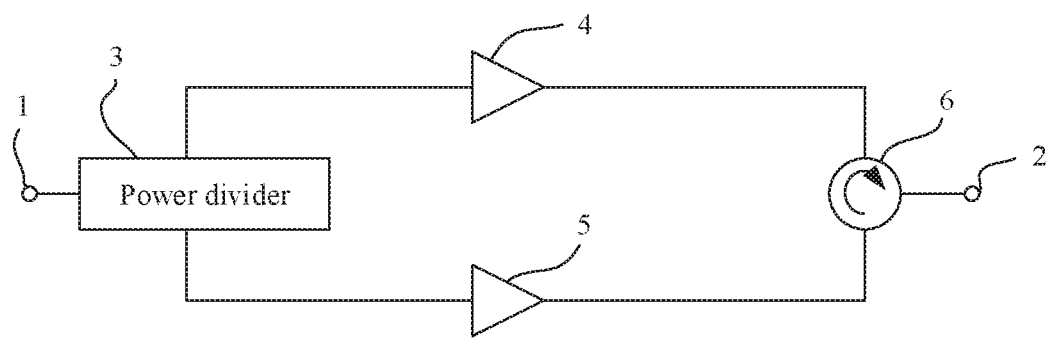
FIG. 1 is a schematic diagram of a load-pull technology at an isolated port according to the prior art.

The following describes the embodiments of this application with reference to accompanying drawings.

The embodiments of this application are applied to a radio frequency signal transmitter of a communications device. The communications device is a wireless communications device, and includes but is not limited to user equipment, a base station, and the like.

The communications device may be user equipment. The user equipment may be configured to communicate with one or more pieces of user equipment (for example, D2D communication), or may be configured to communicate with one or more base stations. The user equipment may also be referred to as a user terminal, and may include some or all functions of a system, a subscriber unit, a subscriber station, a mobile station, a mobile terminal, a mobile device, a node, a device, a remote station, a remote terminal, a terminal, a wireless communications device, a wireless communications apparatus, or a user agent. The user equipment may be a cellular phone, a cordless telephone set, a session initiation protocol (SIP) phone, a smartphone, a wireless local loop (WLL) station, a personal digital assistant (PDA), a laptop computer, a handheld communications device, a handheld computing device, a satellite radio device, a wireless modem card, and/or another processing device configured to communicate on a wireless system. For example, the user equipment may be a mobile terminal that can access a wireless communications network such as 3G, 4G, LTE, or 5G, or may be a mobile terminal that performs device-to-device D2D wireless communication. The mobile terminal may include components such as an RF (Radio Frequency) transmitter (or radio frequency circuit), a memory, another input device, a display screen, a sensor, an audio circuit, an I/O (input/output, input/output) subsystem, a processor, a charging management chip, and a power management chip. The mobile terminal may further include components such as a camera, a Bluetooth module, a virtual key, and a physical key, and details are not described herein. A person skilled in the art may understand that a structure of the foregoing mobile terminal does not constitute a limitation, and may include more or fewer components, or combine some components, separate some components, or use different component arrangements. A common mobile terminal includes, for example, a mobile phone, a tablet computer, a notebook computer, a PDA (Personal Digital Assistant), a palmtop computer, an MID (Mobile Internet Device), a POS (Point of Sales) terminal, a vehicle-mounted computer, and a wearable device (for example, a smart watch, a smart band, or a pedometer).

The communications device may alternatively be a base station. The base station may be configured to communicate with one or more pieces of user equipment, or may be configured to communicate with one or more base stations having some user equipment functions (for example, communication between a macro base station and a micro base station, such as an access point). The base station may also be referred to as an access point, a node, a NodeB, an evolved NodeB (eNB), or another network entity, and may include some or all functions of the foregoing network entity. The base station may communicate with user equipment or another base station by using an air interface. The communication may be performed by using one or more sectors. By converting a received air interface frame into an IP (internet protocol) packet, the base station may be used as a router between a wireless terminal and a remaining part of an access network, where the access network includes an IP network. The base station may further coordinate attribute management of the air interface, and may alternatively be a gateway between a wired network and a wireless network.

The terms used in the embodiments of this application are merely for the purpose of illustrating specific embodiments, and are not intended to limit the present invention. The terms "a" and "the" of singular forms used in the embodiments and the appended claims of the present invention are also intended to include plural forms, unless otherwise specified in the context clearly. It should also be understood that, the term "and/or" used herein indicates and includes any or all possible combinations of one or more associated listed items. The character "/" in this specification usually indicates an "or" relationship between the associated objects. In addition. "first", "second", and the like in this application do not represent importance or a sequence, but merely represent a difference.

The word "example" in the embodiments of the present invention is used to represent giving an example, an illustration, or a description. Any embodiment or design scheme described as an "example" in this application should not be explained as being more or having more advantages than another embodiment or design scheme. Exactly, the word "for example" is used to present a concept in a specific manner. The term "module" used in this application is intended to refer to a device or an entity that can perform digital signal or analog signal processing, or may refer to a computer-related entity. The device or entity may be hardware, firmware, a combination of hardware and software, software.

In the embodiments of the present invention, one of information, signal, message, channel, or data may be used interchangeably sometimes. It should be noted that expressed meanings are consistent when differences are not emphasized. "O", "relevant", and "corresponding" may be interchangeably used sometimes. It should be noted that meanings expressed by the terms are consistent when differences are not emphasized.

A device architecture and a scenario described in the embodiments of the present invention are intended to describe the technical solutions in the embodiments of the present invention more clearly, and do not the technical solutions provided in the embodiments of the present invention. A person of ordinary skill in the art may know that, with evolution of network architectures and emergence of new service scenarios, the technical solutions provided in the embodiments of the present invention are also applicable to similar technical problems.

Figure 2:
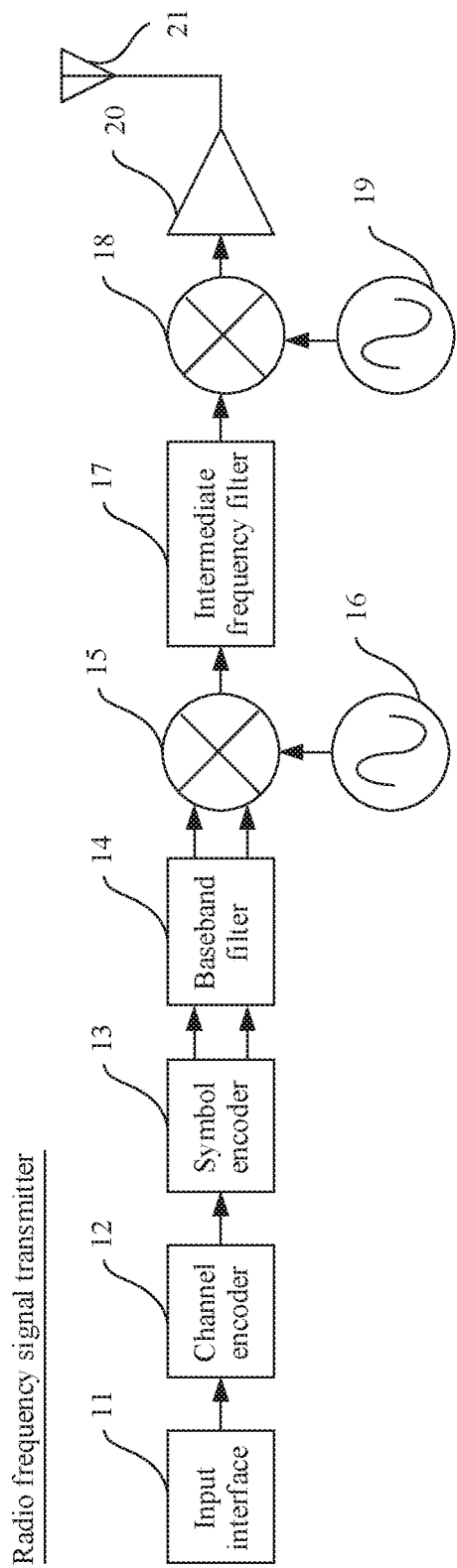
FIG. 2 is a schematic structural diagram of a radio frequency signal transmitter according to an embodiment of this application.

Referring to FIG. 2, an embodiment of this application provides an architecture of a radio frequency signal transmitter. In the radio frequency signal transmitter, an example in which one digital signal is processed to generate one radio frequency signal is used. The radio frequency signal transmitter specifically includes:

an input interface 11, a channel encoder 12, a symbol encoder 13, a baseband filter 14, and an IQ (In-phase/Quadrature, in-phase/quadrature) modulator 15, an intermediate frequency local oscillator 16, an intermediate frequency filter 17, an upconverter 18, a radio frequency local oscillator 19, a power amplifier 20, and an antenna 21. A basic function of the radio frequency signal transmitter shown in FIG. 2 is as follows: A digital signal (data or noise) enters from the input interface 11. After the channel encoder 12 performs at least one type of processing such as channel coding and interleaving on the signal, one I/Q signal, that is, one digital signal, is generated in the symbol encoder 13. The I/Q signal includes an I signal and a Q signal, where the I signal and the Q signal are orthogonal to each other. The I/Q signal is filtered by using the baseband filter 14, and then is upconverted by the I/Q modulator 15 based on a signal in the intermediate frequency local oscillator (IF LO) 16 to an IF intermediate frequency, to obtain an intermediate frequency signal of a predetermined amplitude and a predetermined phase. After passing through the intermediate frequency filter 17 (IF Filter), the intermediate frequency signal is upconverted by the upconverter 18 based on a signal in the radio frequency local oscillator (RF LO) 19, to obtain a radio frequency RF signal, that is, a radio frequency signal, of a predetermined amplitude and a predetermined phase. Therefore, a plurality of groups of radio frequency signals of predetermined amplitudes and predetermined phases may be generated. One radio frequency signal corresponds to one I/Q signal generated by the symbol encoder 13, and an amplitude and a phase of the radio frequency signal are determined by an I signal and a Q signal in the corresponding I/Q signal. Then, the radio frequency signal is fed into the power amplifier 20, and is amplified by the power amplifier 20 and then transmitted by using the antenna 21.

Figure 3:
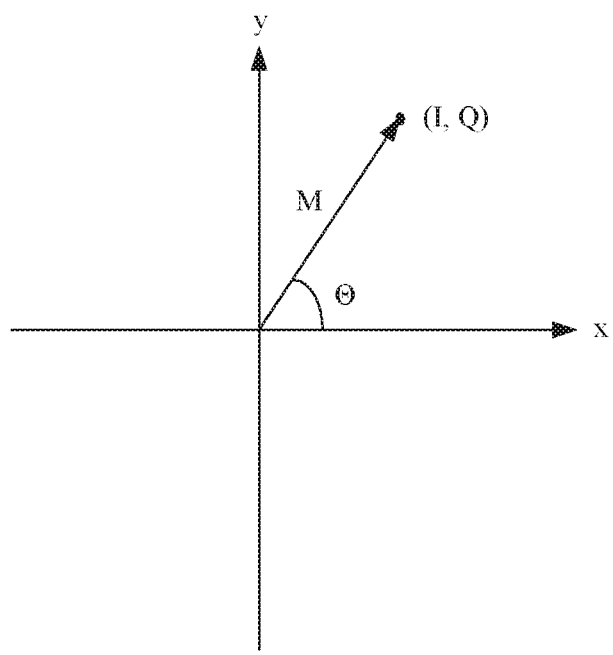
FIG. 3 is a schematic diagram of an IQ modulation method according to an embodiment of this application.

FIG. 2 is merely a block diagram of a relatively common transmitter in which two times of frequency conversion, intermediate frequency conversion and radio frequency conversion, are performed. In addition, transmitters in which a plurality of times of frequency conversion are performed or a baseband signal is directly converted into a radio frequency signal (the I/Q modulator 15 directly generates a radio frequency RF signal) are also applicable to this application. In addition, determining or adjustment of the amplitude and the phase of the radio frequency signal may be implemented in the I/Q modulator 15. Referring to FIG. 3, a principle thereof is as follows: An I signal and a Q signal are two orthogonal signals, and may be considered as points in a rectangular coordinate system (x, y). For example, an amplitude value of the I signal is equivalent to a point on an x-axis, and an amplitude value of the Q signal is equivalent to a point on a y-axis. Therefore, changing amplitudes and phases of the I signal and the Q signal is equivalent to changing locations of points that are in the coordinate system (x, y) and that correspond to the I signal and the Q signal. A signal I+j*Q passing through the I/Q modulator 15 may represent any point (vector) in the coordinate system. To be specific, the I signal is represented as a coordinate y=I(t)=M(t)*cos[Θ (t)] on the y-axis; and the Q signal is represented as a coordinate x=M(t) on the x-axis, where an amplitude is M(t), a phase is Θ (t), and t represents time. Because both the I signal and the Q signal are time-varying signals about t, a signal of any amplitude and phase at any moment under a work condition may be generated in the foregoing manner. Certainly, the amplitude and the phase of the radio frequency signal to be generated may alternatively be implemented in a process in which the channel encoder 12 and the symbol encoder 13 perform digital signal processing.

Figure 4:
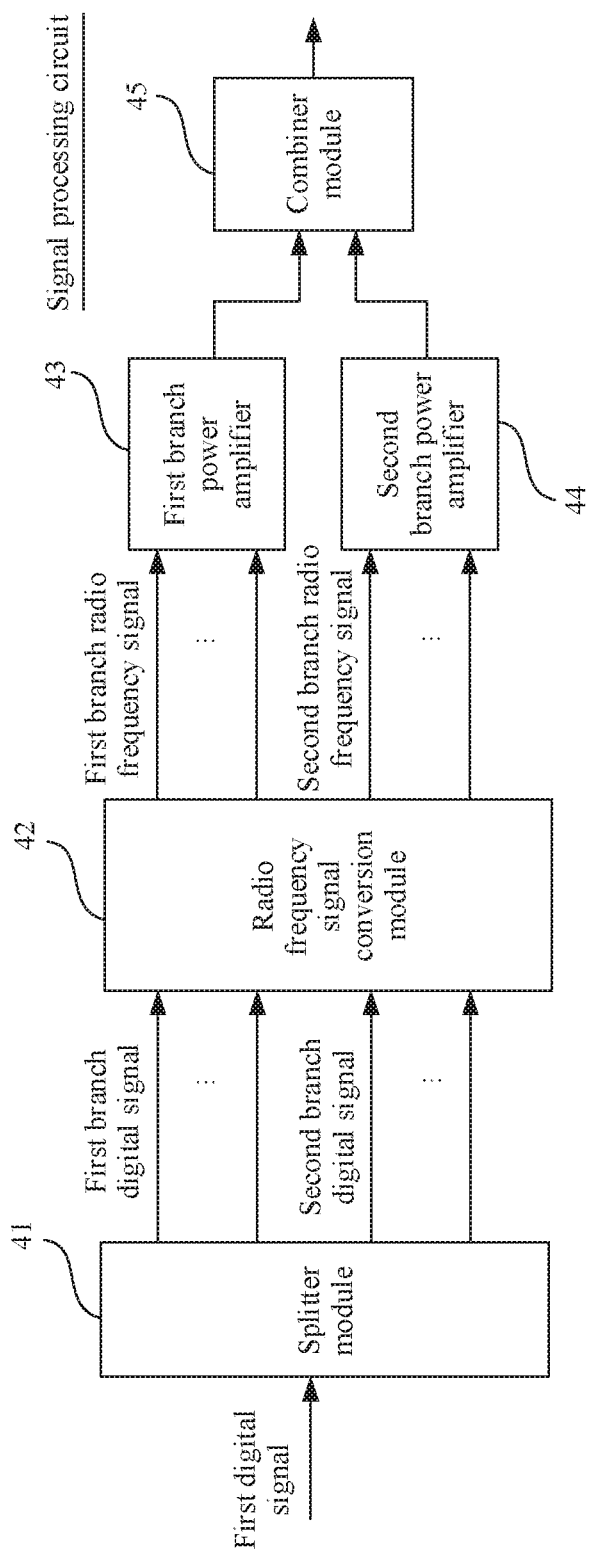
FIG. 4 is a schematic structural diagram of a signal processing circuit according to an embodiment of this application.

Referring to FIG. 4, an embodiment of this application provides a signal processing circuit, and the signal processing circuit may be applied to a radio frequency signal transmitter. The signal processing circuit includes a splitter module 41, a radio frequency signal conversion module 42, a first branch power amplifier 43, a second branch power amplifier 44, and a combiner module 45. The splitter module 41 is connected to the radio frequency signal conversion module 42, the radio frequency signal conversion module 42 is connected to the first branch power amplifier 43 and the second branch power amplifier 44, and the first branch power amplifier 43 and the second branch power amplifier 44 are connected to the combiner module 45.

The splitter module 41 is configured to: receive a first digital signal, split the first digital signal into at least one first branch digital signal and at least one second branch digital signal based on an input power of the first digital signal, and output the at least one first branch digital signal and the at least one second branch digital signal to the radio frequency signal conversion module 42, where a ratio of an amplitude of the at least one first branch digital signal to an amplitude of the at least one second branch digital signal varies with the input power of the first digital signal, and/or a phase difference between the at least one first branch digital signal and the at least one second branch digital signal varies with the input power of the first digital signal.

The radio frequency signal conversion module 32 is configured to: convert the at least one first branch digital signal and the at least one second branch digital signal into at least one first branch radio frequency signal and at least one second branch radio frequency signal 32, and output the at least one first branch radio frequency signal and the at least one second branch radio frequency signal. The first branch power amplifier is configured to: amplify the received at least one first branch radio frequency signal, and output the amplified at least one first branch radio frequency signal to the combiner module. The second branch power amplifier is configured to: amplify the received at least one second branch radio frequency signal, and output the amplified at least one second branch radio frequency signal to the combiner module.

The combiner module 45 is configured to: receive at least one output signal output by the first branch power amplifier 43 and at least one output signal output by the second branch power amplifier 44; and adjust, based on the at least one output signal output by the second branch power amplifier 44, the at least one output signal output by the first branch power amplifier 43, and output the adjusted at least one output signal.

The first branch power amplifier 43 may output the at least one output signal, and the at least one output signal may be directly input to the combiner module 45. Certainly, when there are a plurality of output signals, the plurality of output signals may be combined and then sent to the combiner module 45. In the following embodiments, when an example in which one signal is output to the combiner module is used for description, the first branch power amplifier 43 may output only one output signal or output one signal that is obtained after a plurality of output signals are combined. The following embodiments are described in detail with reference to an example. The second branch power amplifier 44 may output the at least one output signal, and the at least one output signal may be directly input into the combiner module 45. Certainly, when there are a plurality of output signals, the plurality of output signals may be combined and then sent to the combiner module 45. In the following embodiments, an example in which one signal (certainly, the second branch power amplifier 44 may output only one output signal or output one signal that is obtained after a plurality of output signals are combined) is output to the combiner module is used for description.

Optionally, the radio frequency signal conversion module 32 may include one digital-to-analog converter (DAC) or a plurality of digital-to-analog converters. It may be understood that when the radio frequency signal conversion module 32 includes one digital-to-analog converter, the digital-to-analog converter may convert the at least one first branch digital signal and the at least one second branch digital signal into the at least one first branch radio frequency signal and the at least one second branch radio frequency signal, and output the at least one first branch radio frequency signal and the at least one second branch radio frequency signal. When the radio frequency signal conversion module 32 includes a plurality of digital-to-analog converters, each digital-to-analog converter converts one branch digital signal to a radio frequency signal. For example, an ADC 1 converts one first branch digital signal into one first branch radio frequency signal, and an ADC 2 converts one second branch digital signal into one second branch radio frequency signal. Optionally, when the signal processing circuit is applied to the architecture of the foregoing radio frequency signal transmitter, the splitter module 41 may be an independent function entity or device connected to the symbol encoder 13, or the splitter module 41 may be integrated into the symbol encoder 13, or serve as one function module of the symbol encoder 13. In this case, the symbol encoder 13 has a function of the splitter module 41. The radio frequency signal conversion module 32 may include at least one radio frequency signal processing channel that includes the baseband filter 14, the I/Q (In-phase/Quadrature, in-phase/quadrature) modulator 15, the intermediate frequency local oscillator 16, the intermediate frequency filter 17, the frequency booster 18, and the radio frequency local oscillator 19. Each radio frequency signal processing channel can implement a function of converting at least one digital signal into at least one radio frequency signal. Certainly, in some examples, the radio frequency signal processing channel may alternatively include one or more other devices, or one or more devices in the radio frequency signal processing channel are omitted. This is not limited in this application, and is subject to the foregoing function of the radio frequency signal conversion module 32 that can be implemented. The first branch power amplifier 43, the second branch power amplifier 44, and the combiner module 45 jointly constitute the foregoing power amplifier 20.

Because the splitter module can split the first digital signal into the at least one first branch digital signal and the at least one second branch digital signal based on the input power of the first digital signal, and the radio frequency signal conversion module can convert the at least one first branch digital signal and the at least one second branch digital signal into the at least one first branch radio frequency signal and the at least one second branch radio frequency signal, and output the at least one first branch radio frequency signal and the at least one second branch radio frequency signal, where the ratio of the amplitude of the at least one first branch digital signal to the amplitude of the at least one second branch digital signal varies with the input power of the first digital signal, and/or the phase difference between the at least one first branch digital signal and the at least one second branch digital signal varies with the input power of the first digital signal, the at least one first branch radio frequency signal entering the first branch power amplifier and the at least one second branch radio frequency signal entering the second branch power amplifier are adjusted independently from each other. In this way, a phase and an amplitude of each radio frequency signal received by the two branch power amplifiers can be adjusted, to maximize output efficiency of the signal processing circuit. In other words, in the solution of this application, signals in the two branch power amplifiers are more flexibly adjusted. Therefore, power amplification efficiency of the signal processing circuit is further improved.

Constitution of the first branch power amplifier and the second branch power amplifier is described as follows:

Example 1

Figure 5:
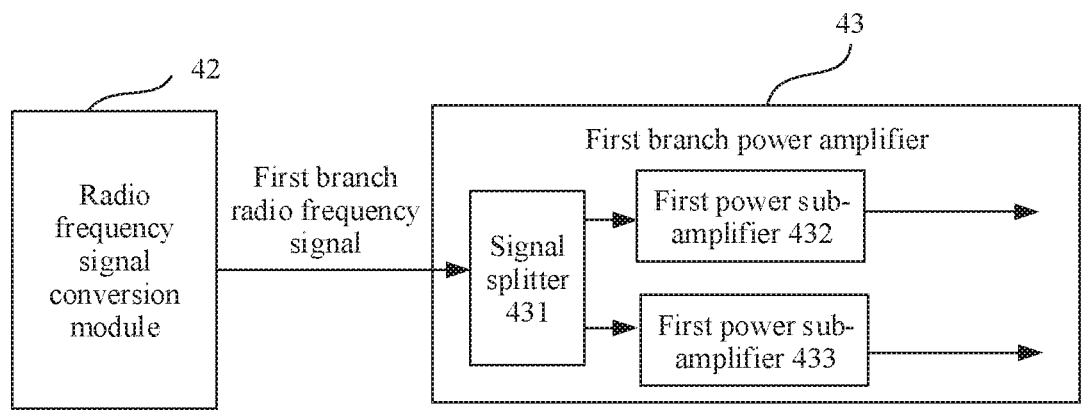
FIG. 5 is a schematic structural diagram of a first branch power amplifier according to an embodiment of this application.

As shown in FIG. 5, the first branch power amplifier 43 includes a first signal splitter 431 and at least two first power sub-amplifiers connected to the first signal splitter 431. In FIG. 5, two first power sub-amplifiers (432 and 433) are used as an example. The first signal splitter 431 has an input port connected to the radio frequency signal conversion module 42, and receives one first branch radio frequency signal, and at least two output ports of the first signal splitter 431 each are connected to one first power sub-amplifier (432 or 433). The first signal splitter 431 is configured to: split the first branch radio frequency signal into at least two radio frequency signals, and output the at least two radio frequency signals. Certainly, the first branch power amplifier 43 may alternatively include a plurality of first signal splitters. For a manner of connecting to each first signal splitter, refer to the connection manner shown in FIG. 5.

Example 2

Figure 6:
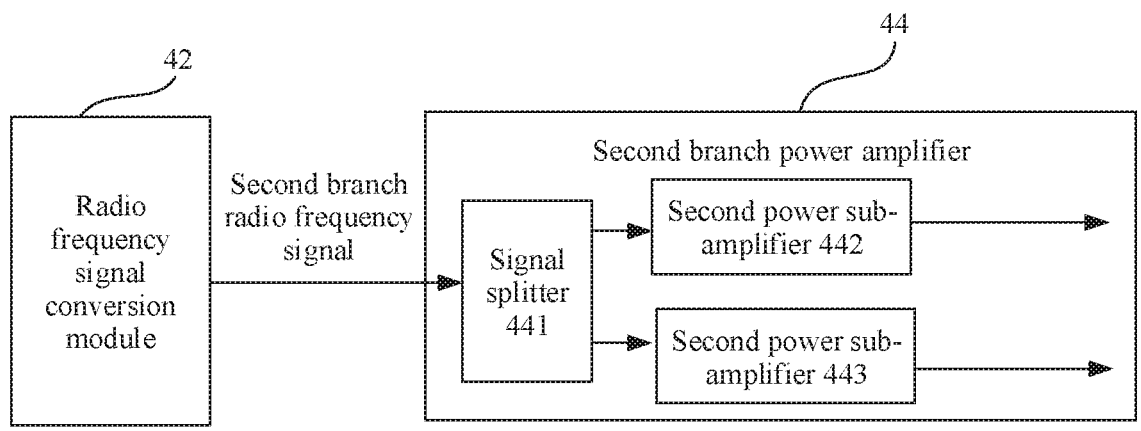
FIG. 6 is a schematic structural diagram of a second branch power amplifier according to an embodiment of this application.

As shown in FIG. 6, the second branch power amplifier 44 includes a second signal splitter 441 and at least two second power sub-amplifiers connected to the second signal splitter 441. In FIG. 6, two second power sub-amplifiers (442 and 443) are used as an example. The second signal splitter 441 has an input port connected to the radio frequency signal conversion module, and receives one second branch radio frequency signal, and at least two output ports of the second signal splitter 441 each are connected to one second power sub-amplifier (442 or 443). The second signal splitter 441 is configured to: split the second branch radio frequency signal into at least two radio frequency signals, and output the at least two radio frequency signals. Certainly, the second branch power amplifier 44 may alternatively include a plurality of second signal splitters. For a manner of connecting to each second signal splitter, refer to the connection manner shown in FIG. 6.

Example 3

Figure 7:
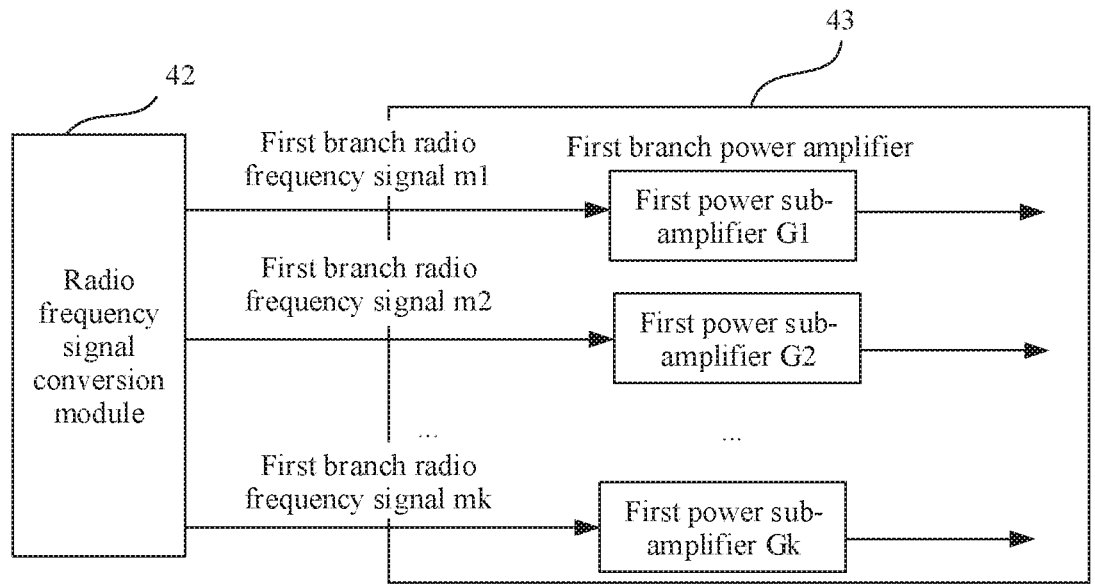
FIG. 7 is a schematic structural diagram of a first branch power amplifier according to another embodiment of this application.

As shown in FIG. 7, the first branch power amplifier 43 includes at least one first power sub-amplifier. Any first power sub-amplifier in the at least one first power sub-amplifier has an input port connected to the radio frequency signal conversion module 42, and receives one first branch radio frequency signal. As shown in FIG. 7, a first branch radio frequency signal m1 is input into a first power sub-amplifier G1; and a first branch radio frequency signal m2 is output into a second power sub-amplifier G2, . . . , and a first branch radio frequency signal mk is input into a second power sub-amplifier Gk.

Example 4

Figure 8:
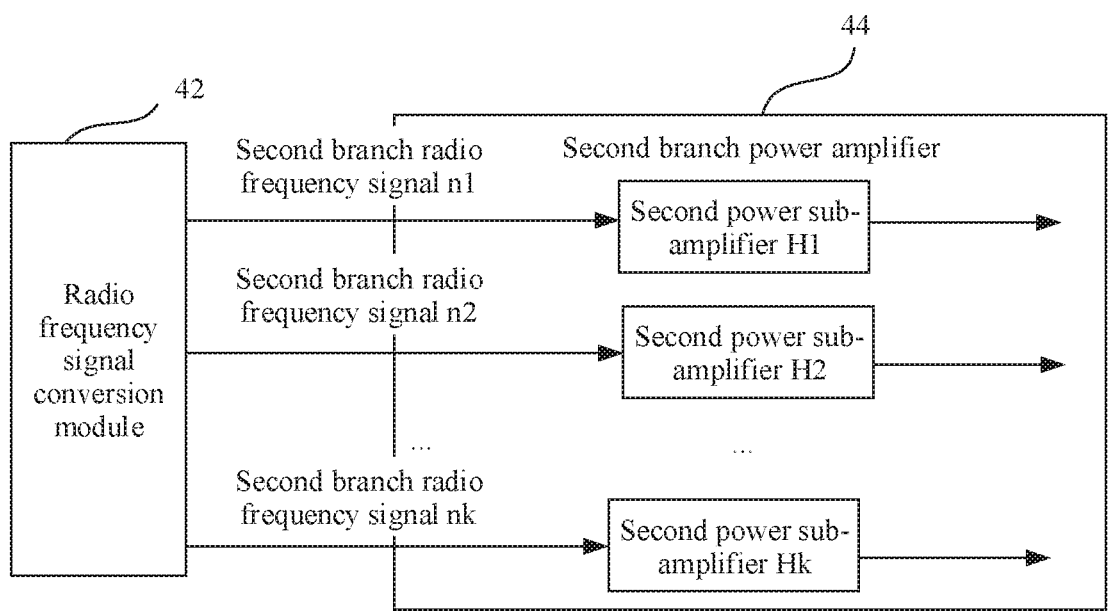
FIG. 8 is a schematic structural diagram of a second branch power amplifier according to another embodiment of this application.

As shown in FIG. 8, the second branch power amplifier 44 includes at least one second power sub-amplifier. Any second power sub-amplifier in the at least one second power sub-amplifier has an input port connected to the radio frequency signal conversion module, and receives one second branch radio frequency signal. As shown in FIG. 8, a second branch radio frequency signal n1 is input into a second power sub-amplifier H1, a second branch radio frequency signal n2 is input into a second power sub-amplifier H2, . . . , and a second branch radio frequency signal nk is input into a second power sub-amplifier Hk.

It may be understood that a power amplifier circuit may have a structure obtained by using any one of a combination of structures in the foregoing Example 1 to Example 4. In the foregoing Example 1 to Example 4, a form of a signal output by the first branch power amplifier 43 to the combiner module 45 is not limited. As described above, the first branch power amplifier 43 may output at least one output signal, and the at least one output signal may be directly input to the combiner module 45. Certainly, when there are a plurality of output signals, the signals may be combined and then sent to the combiner module 45. In the foregoing Example 1 to Example 4, a form of a signal output by the second branch power amplifier 44 to the combiner module 45 is not limited. As described above, the second branch power amplifier 44 may output at least one output signal, and the at least one output signal may be directly input to the combiner module 45. Certainly, when there are a plurality of output signals, the signals may be combined and then sent to the combiner module 45. In the following embodiments, an example in which one signal (certainly, the second branch power amplifier 44 may output only one output signal or output one signal that is obtained after a plurality of output signals are combined) is output to the combiner module is used for description. For example, the first branch power amplifier 43 may include at least one of the following power amplifier types: a single-tube power amplifier, a Doherty power amplifier, a Chireix power amplifier, an outphasing power amplifier, and an envelope tracking ET power amplifier. For example, the second branch power amplifier 44 may include at least one of the following power amplifier types: a single-tube power amplifier, a Doherty power amplifier, a Chireix power amplifier, an outphasing power amplifier, and an ET power amplifier.

Figure 9:
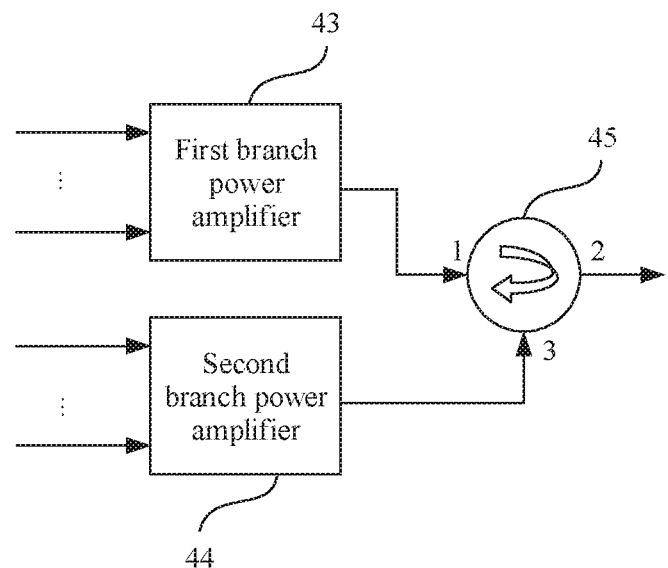
FIG. 9 is a schematic diagram of a manner of connecting to a combiner module according to an embodiment of this application.

Based on the foregoing possible structures of the first branch power amplifier and the foregoing possible structures of the second branch power amplifier, an example of the combiner module in this embodiment of this application is described as follows:

In an example, FIG. 9 shows a manner of connecting the first branch power amplifier, the second branch power amplifier, and the combiner module. The combiner module 45 includes a three-port device, the first branch power amplifier 43 includes one output port, and the second branch power amplifier 44 includes one output port. A first port of the three-port device is connected to the output port of the first branch power amplifier 43, and the first branch power amplifier 43 is specifically configured to: amplify the received at least one first branch radio frequency signal, and output the amplified at least one first branch radio frequency signal to the first port of the three-port device. It should be noted that, if the first branch power amplifier 43 includes only one first power sub-amplifier, the first branch power amplifier 43 outputs an output signal in the first power sub-amplifier; or if the first branch power amplifier 43 includes two or more first power sub-amplifiers, the first branch power amplifier 43 further needs to combine output signals in the two or more first power sub-amplifiers. The two or more first power sub-amplifiers may form the first branch power amplifier with reference to the structure in Example 1 shown in FIG. 5 or the structure in Example 3 shown in FIG. 7. A third port of the three-port device is connected to the output port of the second branch power amplifier 44, and the second branch power amplifier 44 is specifically configured to: amplify the received at least one second branch radio frequency signal, and output the amplified at least one second branch radio frequency signal to the third port of the three-port device. It should be noted that, if the second branch power amplifier 44 includes only one second power sub-amplifier, the second branch power amplifier 44 outputs an output signal in the second power sub-amplifier; or if the second branch power amplifier 44 includes two or more second power sub-amplifiers, the second branch power amplifier 44 further needs to combine output signals in the two or more second power sub-amplifiers. The two or more second power sub-amplifiers may form the first branch power amplifier with reference to the structure in Example 2 shown in FIG. 6 or the structure in Example 4 shown in FIG. 8. The three-port device is configured to: adjust, based on the signal received through the third port, the signal received through the first port, and output the signal through a second port of the three-port device. A typical three-port device is a circulator. As shown in FIG. 9, a three-port device is implemented by using a circulator. The circulator implements (approximate) unidirectional transmission from a port 3 to a port 1, and (approximate) unidirectional transmission from the port 1 to a port 2. Therefore, an effect of an output impedance of a circuit connected to the port 1 is adjusted by changing an input (current) at the port 3. In some examples, the port 1 of the circulator is also referred to as an input port, the port 2 is also referred to as an output port, and the port 3 is also referred to as an isolated port.

Specifically, currents and voltages at the three ports of the circulator are respectively:

$I_1 = I_2 - I_3$ $I_2 = I_1 + I_3$ $V_3 = I_3 \cdot Z_0$ $V_2 = I_2 \cdot Z_0 = Z_0(I_1 + I_3)$ $V_1 = (I_3 \cdot Z_0) + (I_2 \cdot Z_0) = Z_0(I_1 + 2I_3)$ $V_1$ is a voltage at the port 1, $I_1$ is a current at the port 1, $I_2$ is a voltage at the port 2, $I_2$ is a current at the port 2, $I_3$ is a voltage at the port 3, $V_3$ is a current at the port 3, and $Z_0$ is a characteristic impedance of the circulator.

Therefore, an output impedance of the first branch power amplifier 43 is:

$$Z_1 = \frac{V_1}{I_1} = \frac{Z_0(I_2 + 2I_3)}{I_1} = Z_0\left(1 + \frac{2I_3}{I_1}\right)$$

Load pull on the first branch power amplifier 43 can be implemented by changing a phase and an amplitude of an output current $I_3$ of the second branch power amplifier 44. In this way, the power amplifier can work efficiently in high power back-off.

Figure 10:
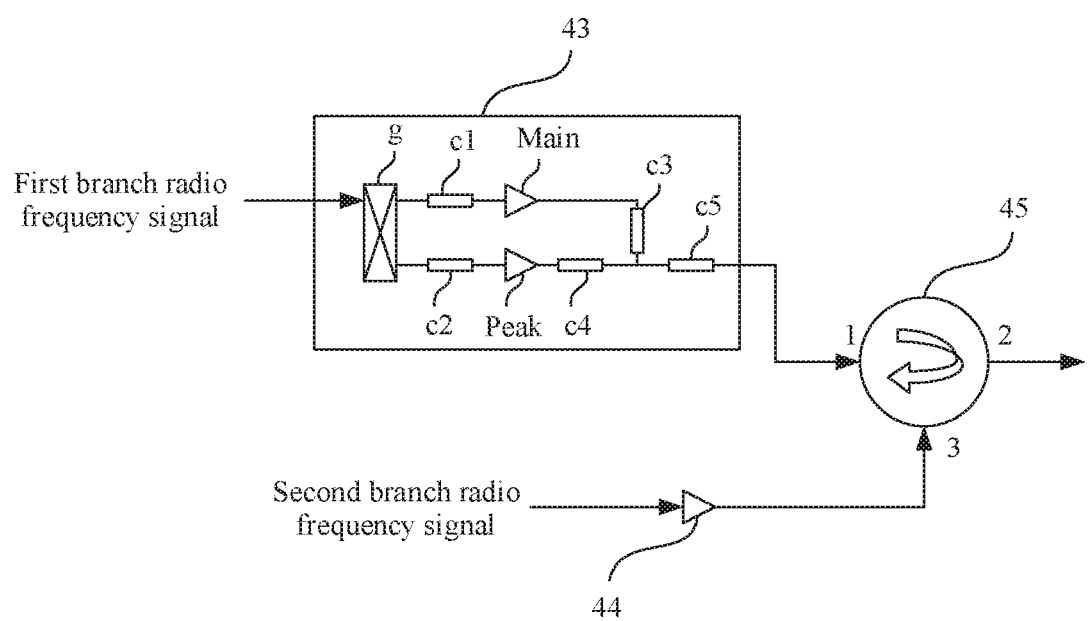
FIG. 10 is a schematic diagram of a manner of connecting to a combiner module according to another embodiment of this application.

As shown in FIG. 10, a first branch power amplifier 43 may include a two-branch Doherty power amplifier, and input a first branch radio frequency signal. A second branch power amplifier 44 is a single-tube class-B power amplifier, and inputs a second branch radio frequency signal. The Doherty power amplifier includes a power divider g (divider, where the power divider may use a hybrid coupler), a main power amplifier (main PA), and a peaking power amplifier (peaking PA, or an auxiliary PA, auxiliary power amplifier). The power divider g, the main power amplifier (main PA), and the peaking power amplifier (peaking PA) are connected to a port 1 of a circulator 45 by using an impedance matching network. The power divider g splits a first branch radio frequency signal into two signals, and respectively transmits the two signals to the main power amplifier (main PA) and the peaking power amplifier (peaking PA). Optionally, the impedance matching network includes an input impedance matching circuit c1 disposed between the power divider g and the main power amplifier (main PA), and an input impedance matching circuit c2 disposed between the power divider g and the peaking power amplifier (peaking PA), a first output impedance conversion circuit c3 disposed at an output port of the main power amplifier (main PA), a second output impedance conversion circuit c4 disposed at an output port of the peaking power amplifier (peaking PA), and an output impedance matching circuit c5 connecting the first output impedance conversion circuit c3 and the second output impedance conversion circuit c4 to of the port 1 of the circulator 45. The second branch power amplifier 44 is a single-tube class-B power amplifier, and a larger amplitude of a fundamental voltage of the second branch power amplifier 44 indicates a higher output power and higher circuit efficiency of the power amplifier. When a low power is input, an efficiency curve of the Doherty power amplifier is similar to that of the single-tube class-B power amplifier. When a high power is output, the peaking power amplifier (peaking PA) is enabled, and a power amplifier circuit maintains relatively high efficiency in a back-off range. Total efficiency $\eta_3$ of the power amplifier circuit is determined by efficiency of the two branch power amplifiers and a ratio of total powers of the two branch power amplifiers:

$$\eta_3 = \frac{P_1 + P_2}{\frac{P_1}{\eta_1} + \frac{P_2}{\eta_2}} = \frac{1 + \alpha}{\frac{1}{\eta_1} + \frac{\alpha}{\eta_2}} = \frac{\eta_1 \eta_2 (1 + \alpha)}{\eta_2 + \alpha \eta_1},$$

where efficiency of the first branch power amplifier 43 is $\eta_1$, efficiency of the second branch power amplifier 44 is $\eta_2$, a total power of the first branch power amplifier 43 is $P_1$, and a total power of the second branch power amplifier 44 $P_2$, where $$\alpha = \frac{P_1}{P_2}.$$

To obtain high efficiency, it needs to be ensured that $$Z_1 = \frac{V_1}{I_1} = \frac{Z_0(I_2 + 2I_3)}{I_1} = Z_0\left(1 + \frac{2I_3}{I_1}\right)$$

is a real number. To be specific, an output current of the Doherty power amplifier of the first branch power amplifier 43 and an output current of the single-tube class-B power amplifier of the second branch power amplifier 44 are in same phase or in reverse phase. The first branch power amplifier 43 and the second branch power amplifier 44 each can be at a high-efficiency point or in a zero-output power state by controlling an output current of the second branch power amplifier 44, to implement high-efficiency output of the power amplifier circuit. In this embodiment of this application, any radio frequency signal in the at least one first branch radio frequency signal input into the first branch power amplifier 43 is different from any radio frequency signal in the at least one second branch radio frequency signal input into the second branch power amplifier 44. Therefore, provided that at least one first branch radio frequency signal input into the first branch power amplifier and at least one second branch radio frequency signal input into the second branch power amplifier are independently adjusted, a phase and an amplitude of each radio frequency signal in the branch radio frequency signals received by the two branch power amplifiers can satisfy that the two branch power amplifiers are respectively at a high-efficiency point or in a zero output power state, so that the output efficiency of the power amplifier circuit is maximized. In other words, in the solution of this application, signals of the two branch power amplifiers are more flexibly adjusted. Therefore, power amplification efficiency of the signal processing circuit is improved.

Figure 11:
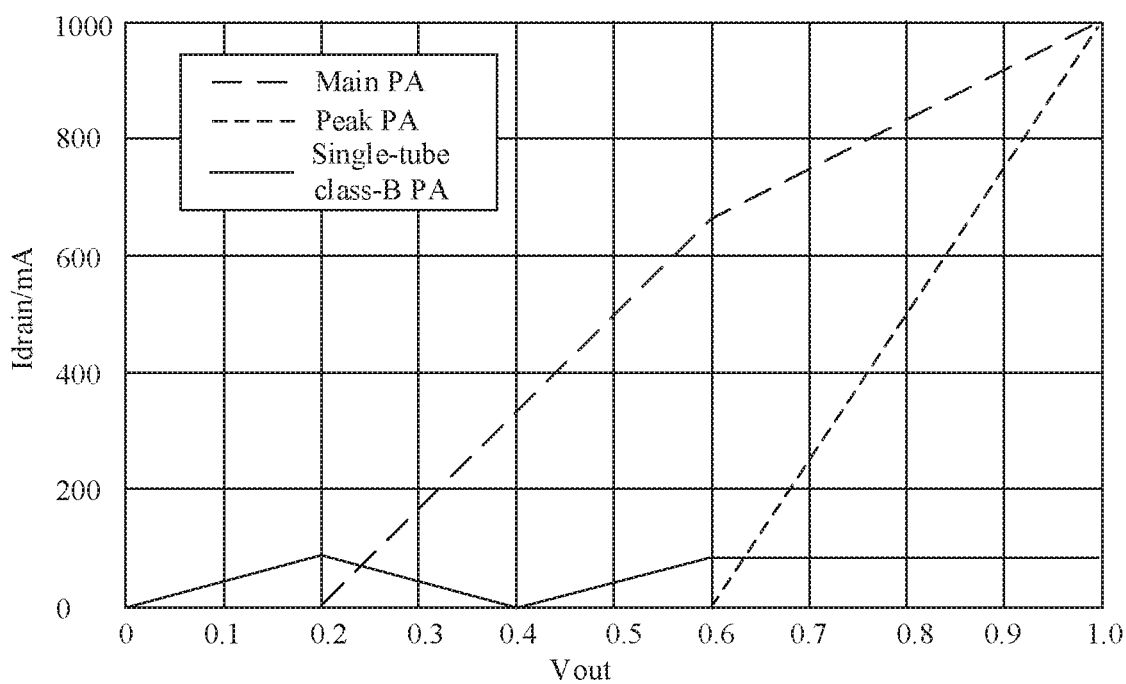
FIG. 11 is a schematic diagram of a relationship between a linear back-off voltage Vout and a drain current Idrain of each of a main PA, a peaking PA, and a single-tube class-B power amplifier in a signal processing circuit according to an embodiment of this application.
Figure 12:
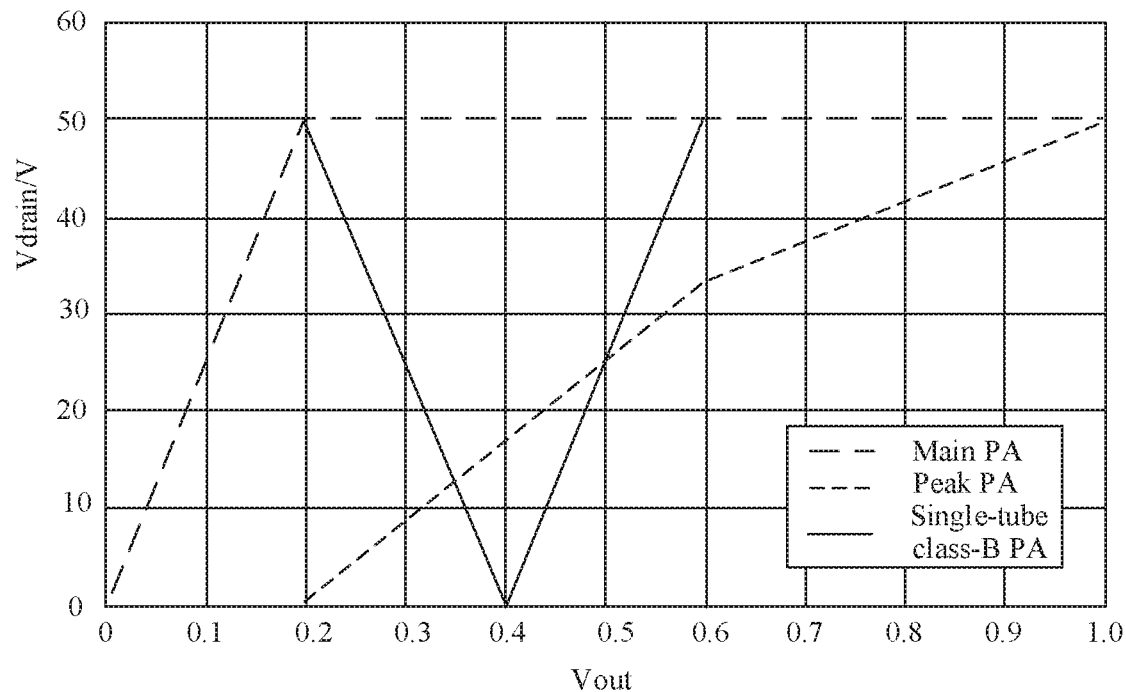
FIG. 12 is a schematic diagram of a relationship between a linear back-off voltage Vout and a drain voltage Vdrain of each of a main PA, a peaking PA, and a single-tube class-B power amplifier in a signal processing circuit according to an embodiment of this application.
Figure 13:
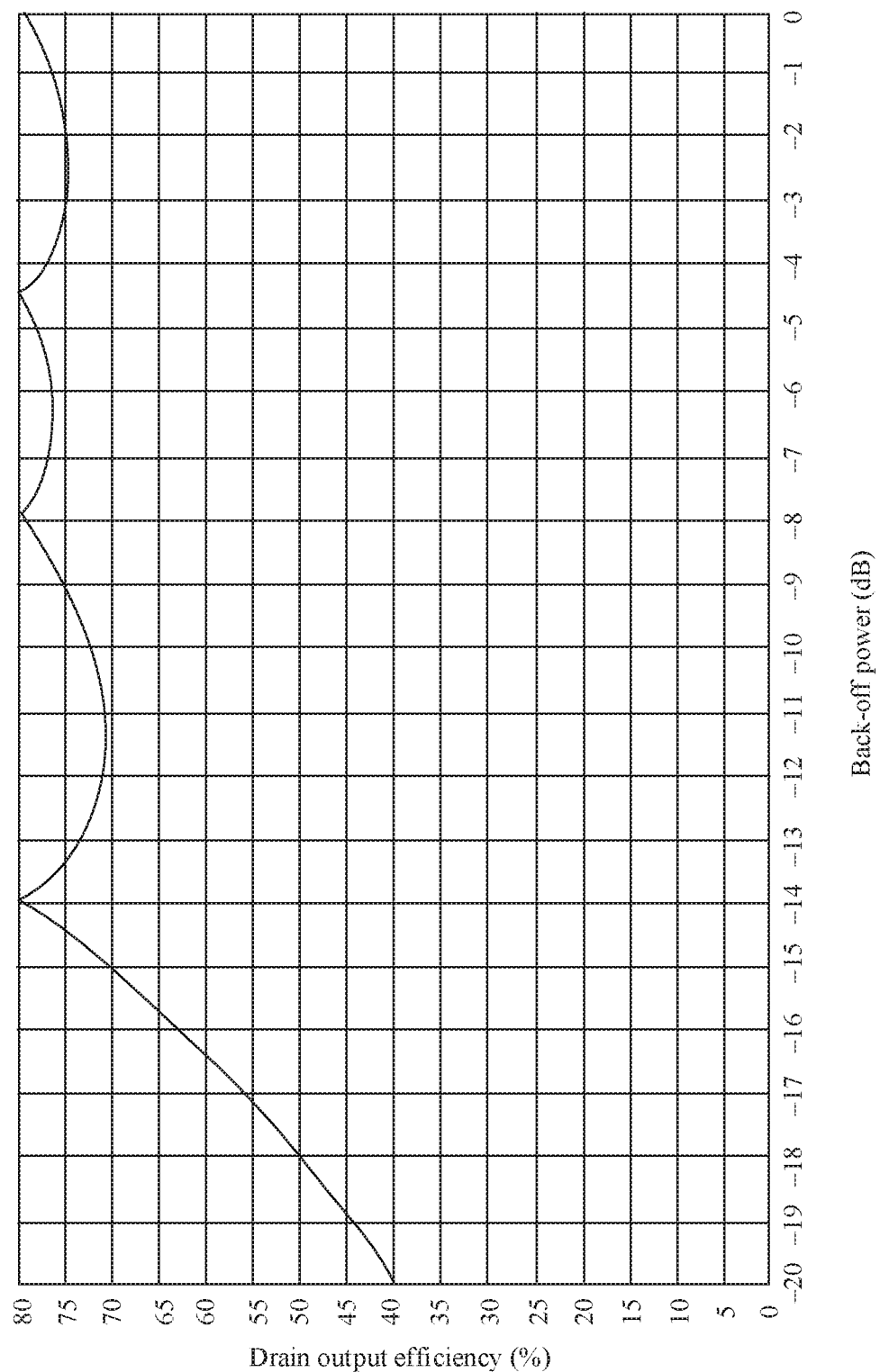
FIG. 13 is a schematic diagram of an efficiency curve of a signal processing circuit in power back-off according to an embodiment of this application.
Figure 14:
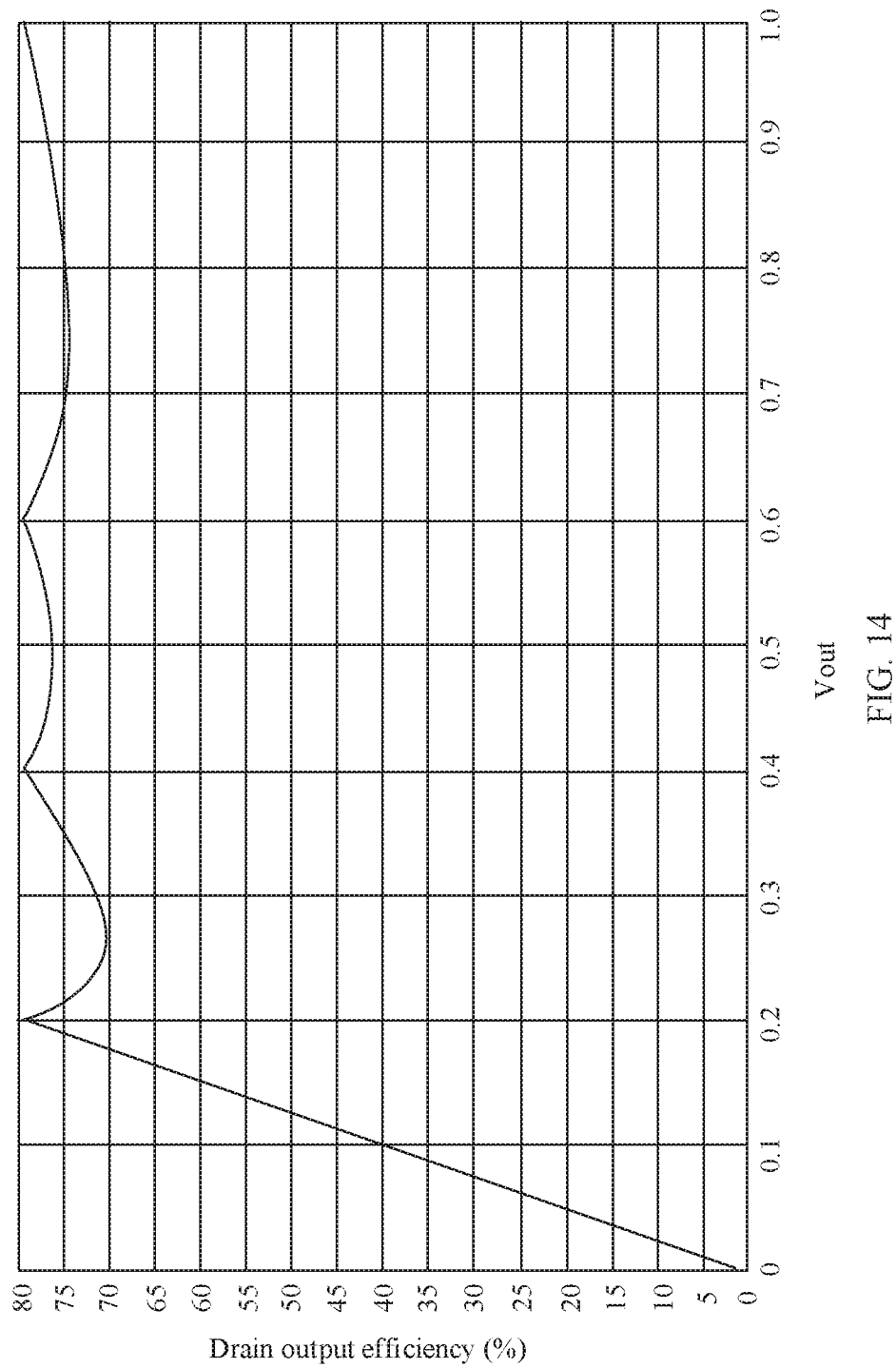
FIG. 14 is a schematic diagram of an efficiency curve of a signal processing circuit in linear back-off according to an embodiment of this application.
Figure 15:
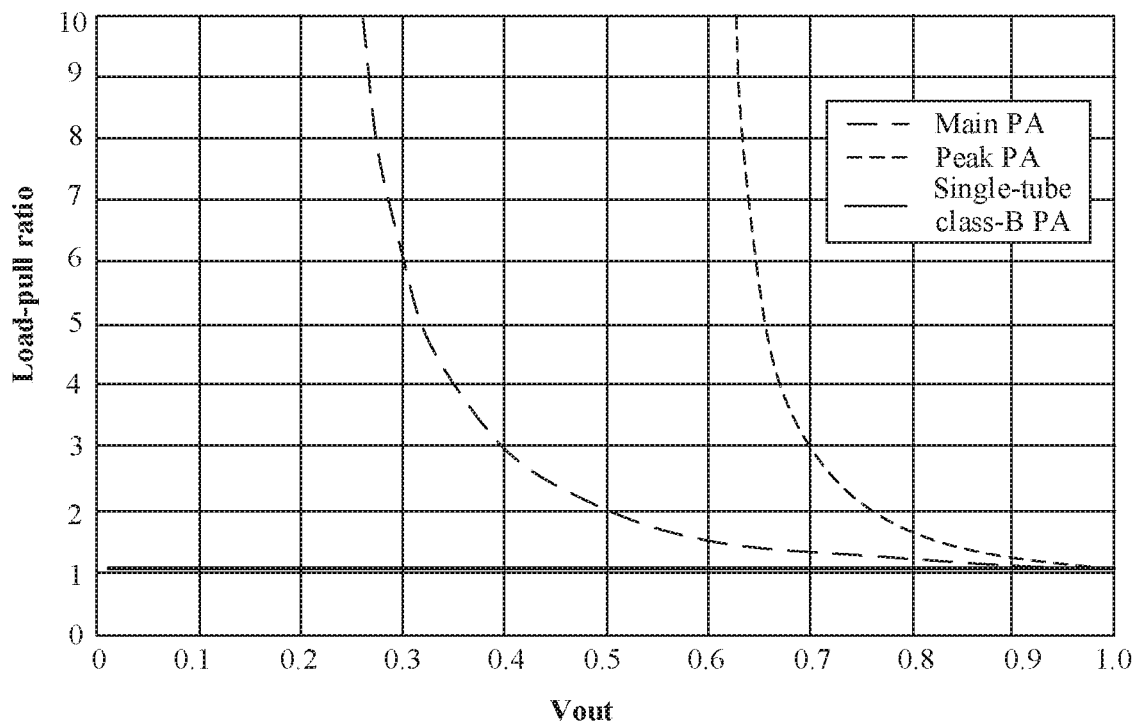
FIG. 15 is a schematic diagram of a relationship between linear back-off and a linear load-pull ratio of each of a main PA, a peaking PA, and a single-tube class-B power amplifier in a signal processing circuit according to an embodiment of this application.

For example, in the embodiment shown in FIG. 10, a ratio of saturation output powers of the Main PA and the peaking PA of the Doherty power amplifier of the first branch power amplifier and the single-tube class-B power amplifier of the second branch power amplifier is 12:12:1 (the power ratio may be any ratio, and is not limited to this example). FIG. 11 to FIG. 15 show simulation of characteristic data of each part of a power amplifying circuit of the signal processing circuit. FIG. 11 shows a relationship between a linear back-off voltage Vout and a drain current Idrain of each of the main PA, the peaking PA, and the single-tube class-B power amplifier of the two branch power amplifiers. FIG. 12 shows a relationship between a drain voltage Vdrain and the linear back-off voltage Vout. FIG. 13 shows an efficiency curve in power back-off, where a horizontal axis represents a back-off power in a unit of dB, and a vertical axis represents drain output efficiency. FIG. 14 shows an efficiency curve in linear back-off, where a horizontal axis represents a back-off voltage Vout, and a vertical axis represents drain output efficiency. FIG. 15 shows a relationship between linear back-off and a linear load-pull ratio of each of the main PA, the peaking PA, and the single-tube class-B power amplifier of the two branch power amplifiers. It can be learned from FIG. 11 to FIG. 15 that, four or more high efficiency points can be obtained in high power back-off by adjusting signal amplitudes and phases of the first branch radio frequency signal and the second branch radio frequency signal in the two branch power amplifiers.

The Doherty power amplifier shown in FIG. 10 may be replaced with an ADoherty (Asymmetric Doherty) power amplifier or a Chireix power amplifier.

Optionally, the second branch power amplifier in this embodiment of this application may alternatively be replaced with another type of a single-tube power amplifier, a Doherty power amplifier, a Chireix power amplifier, an outphasing power amplifier, or an ET power amplifier, or the second branch power amplifier may include at least one of the foregoing power amplifiers.

Figure 16:
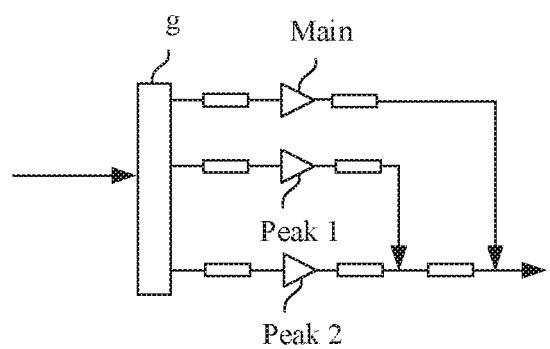
FIG. 16 is a schematic structural diagram of a three-way Doherty power amplifier or a three-way Chireix PA according to an embodiment of this application.
Figure 17:
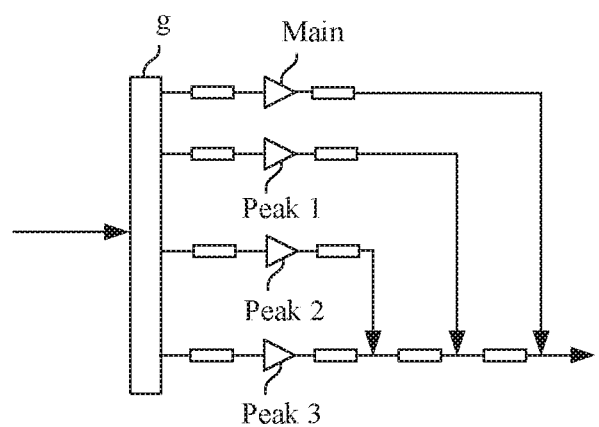
FIG. 17 is a schematic structural diagram of a four-branch Doherty power amplifier or a four-branch Chireix power amplifier according to an embodiment of this application.
Figure 18:
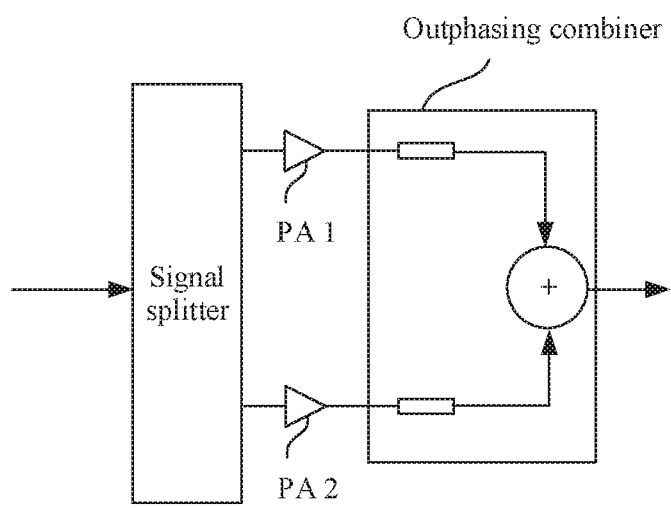
FIG. 18 is a schematic structural diagram of an outphasing power amplifier according to an embodiment of this application.

FIG. 16 is a schematic structural diagram of a three-way Doherty power amplifier or a three-way Chireix power amplifier. A structure of the three-way Doherty power amplifier or the three-way Chireix power amplifier is similar to that of the two-branch Doherty power amplifier of the first branch power amplifier shown in FIG. 10, and the three-way Doherty power amplifier or the three-way Chireix power amplifier includes one main power amplifier (main PA), two peaking power amplifiers (a peaking PA 1 and a peaking PA 2), and an impedance matching network. FIG. 17 is a schematic structural diagram of a four-branch Doherty power amplifier or a four-branch Chireix power amplifier. The four-branch Doherty power amplifier or the four-branch Chireix power amplifier includes a main power amplifier (main PA), three peaking power amplifiers (a peaking PA 1, a peaking PA 2, and a peaking PA 3), and an impedance matching network. FIG. 18 is a schematic structural diagram of an outphasing power amplifier. The outphasing power includes a signal splitter, two power amplifiers (a PA 1 and a PA 2), and an outphasing combiner.

Figure 19:
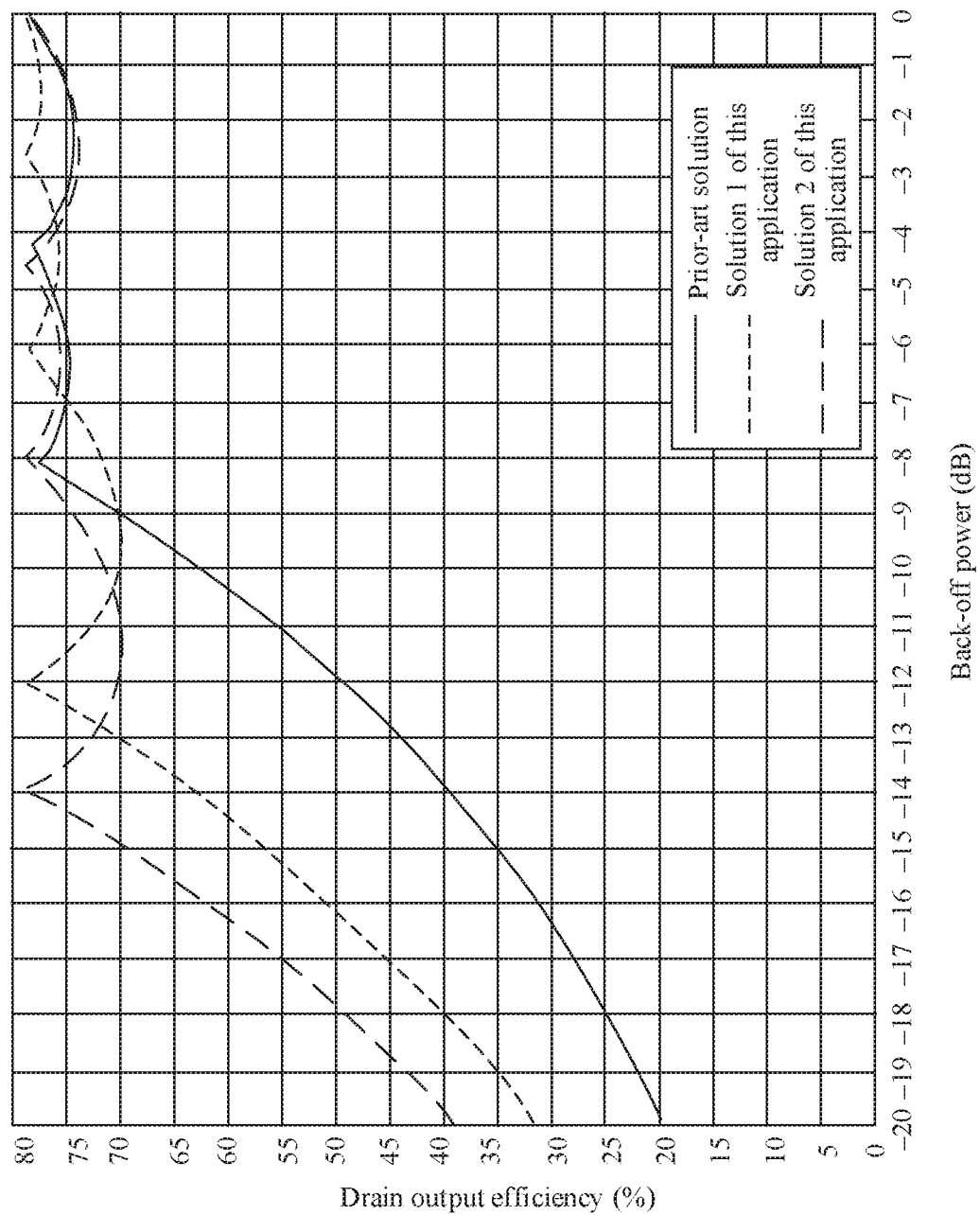
FIG. 19 is a schematic diagram of a curve of a back-off power and drain output efficiency of a signal processing circuit according to an embodiment of this application.

FIG. 19 shows a curve of back-off power and drain output efficiency of a three-way Doherty power amplifier in a prior-art solution and a curve of back-off power and drain output efficiency of a power amplifier according to an embodiment of this application. In "solution 1 of this application", an example in which a first branch power amplifier uses a class-AB power amplifier and a second branch power amplifier uses a single-tube class-B power amplifier is used in this embodiment of this application. In "solution 2 of this application", an example in which a first branch power amplifier uses a two-branch Doherty power amplifier, and a second branch power amplifier uses a single-tube class-B power amplifier is used in this embodiment of this application. Load pull on the first branch power amplifier by the second branch power amplifier is implemented by controlling phases and amplitudes of radio frequency signals input by the two branch power amplifiers, thereby implementing high-efficiency work in higher-power back-off. A ratio a of a total peak power of the first branch power amplifier to a total peak power of the second branch power amplifier is related to a back-off range in which the entire power amplifier circuit works. A larger ratio indicates a larger back-off range of the power amplifier circuit, and a theoretical maximum back-off value is $10*lg(a+1)$. In addition, the ratio affects a quantity of high-efficiency points (extreme points) that can be obtained within the back-off range. When the ratio is greater than 3 and less than 8, three high-efficiency extreme points can be obtained. When the ratio is greater than 8, four high-efficiency extreme points can be obtained.

Figure 20:
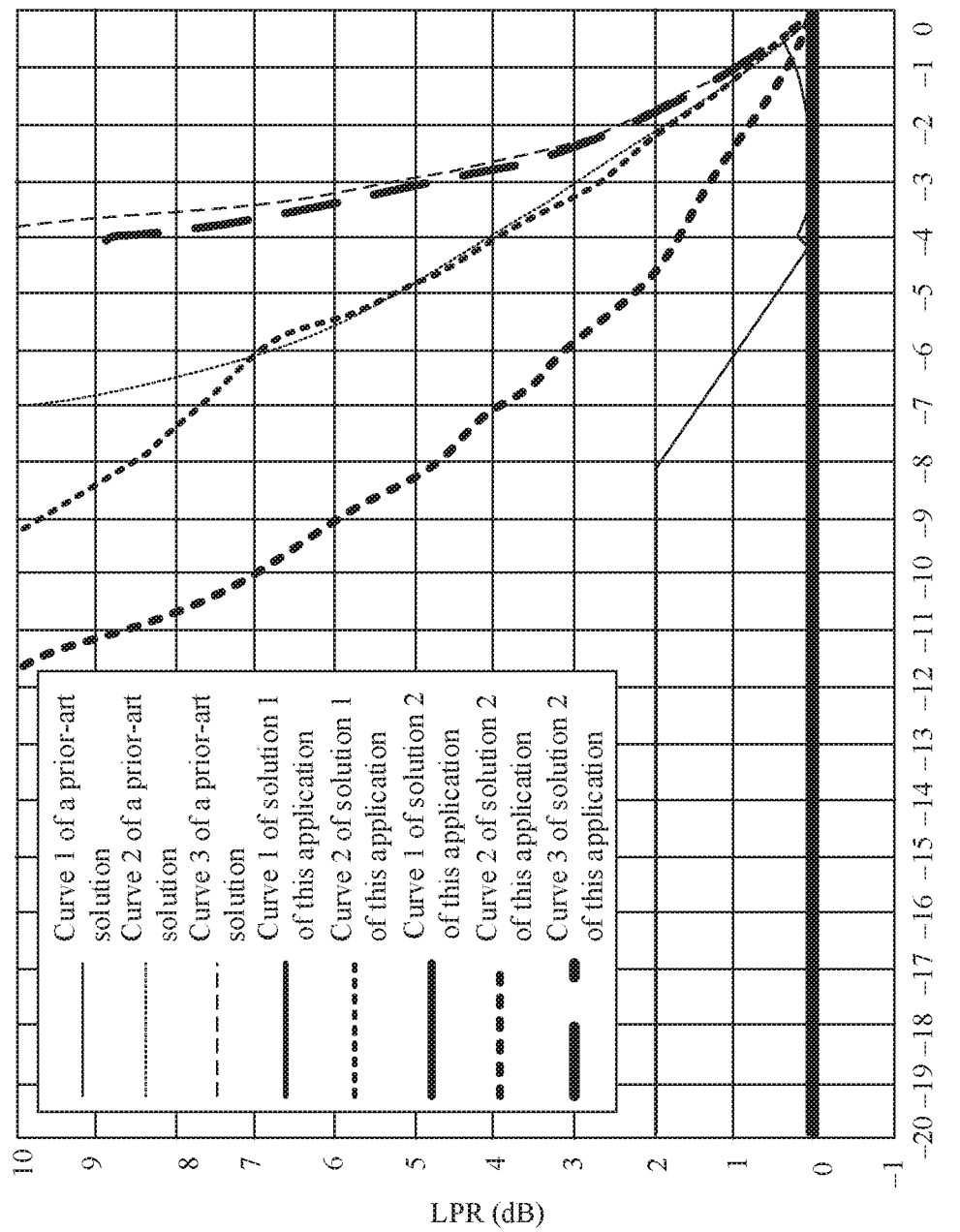
FIG. 20 is a schematic diagram of a curve of a back-off power and an LPR of a signal processing circuit according to an embodiment of this application.

As shown in FIG. 20, "curve 1 of a prior-art solution" provides a curve of a back-off power of a three-way Doherty power amplifier and a load-pull ratio (LPR) of a main PA in the prior art, "curve 2 of a prior-art solution" provides a curve of a back-off power of a three-way Doherty power amplifier and an LPR of a peaking PA 1 in the prior art, "curve 3 of a prior-art solution" provides a curve of a back-off power of a three-way Doherty power amplifier and an LPR of a peaking PA 2 in the prior art, "curve 1 of solution 1 of this application" provides a curve of a back-off power of a class-AB power amplifier used by a first branch power amplifier and an LPR of a second branch power amplifier in this embodiment of this application, "curve 2 of solution 1 of this application" provides a curve of a back-off power of a class-AB power amplifier used by a first branch power amplifier and an LPR of a first branch power amplifier in this embodiment of this application, "curve 1 of solution 2 of this application" provides a curve of a back-off power of a two-branch Doherty power amplifier used by a first branch power amplifier and an LPR of a second branch power amplifier in this embodiment of this application, "curve 2 of solution 2 of this application" provides a curve of a back-off power of a two-branch Doherty power amplifier used by a first branch power amplifier and an LPR of a main PA of a first branch power amplifier in this embodiment of this application, and "curve 3 of solution 2 of this application" provides a curve of a back-off power of a two-branch Doherty power amplifier used by a first branch power amplifier and an LPR of a peaking PA of a first branch power amplifier in this embodiment of this application. In a solution of a class-AB power amplifier or a two-branch Doherty power amplifier that is used by the first branch power amplifier, more high-efficiency points in higher-power back-off may be obtained, and a load pull of each power tube in the first branch power amplifier is smaller than that of a power tube of a three-way Doherty power amplifier in the prior art. In actual use, work efficiency of each way of power amplifier is related to a load-pull ratio. A smaller load-pull ratio indicates higher work efficiency of each way of power amplifier.

Figure 21:
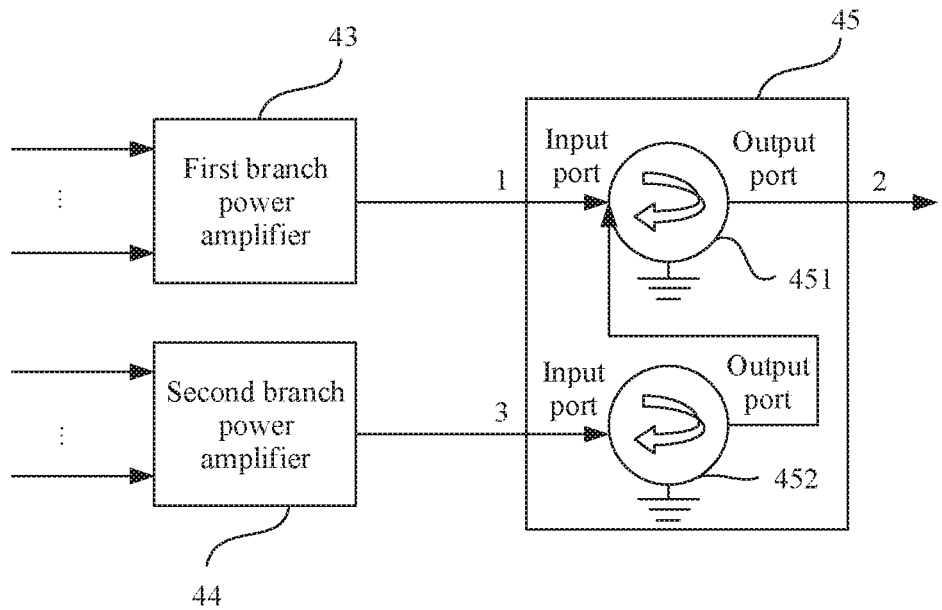
FIG. 21 is a schematic diagram of a manner of connecting to a combiner module according to still another embodiment of this application.

In another example, referring to FIG. 21, a three-port device 45 includes a first isolator 451 and a second isolator 452. An input port of the first isolator 451 is connected to a first port (port 1) of the three-port device, and an output port of the first isolator is connected to a second port (port 2) of the three-port device. An input port of the second isolator 452 is connected to a third port (port 3) of the three-port device, and an output port of the second isolator is connected to the first port (port 1) of the three-port device. Because of a unidirectional conduction function of an isolator, a function similar to that of a circulator is implemented. Specifically, the second isolator 452 is configured to transmit a signal received through the third port of the three-port device to the input port of the first isolator. The first isolator 451 is configured to adjust, based on the signal received through the third port of the three-port device, a signal received through the first port of the three-port device, and output the signal through the second port of the three-port device.

Figure 22:
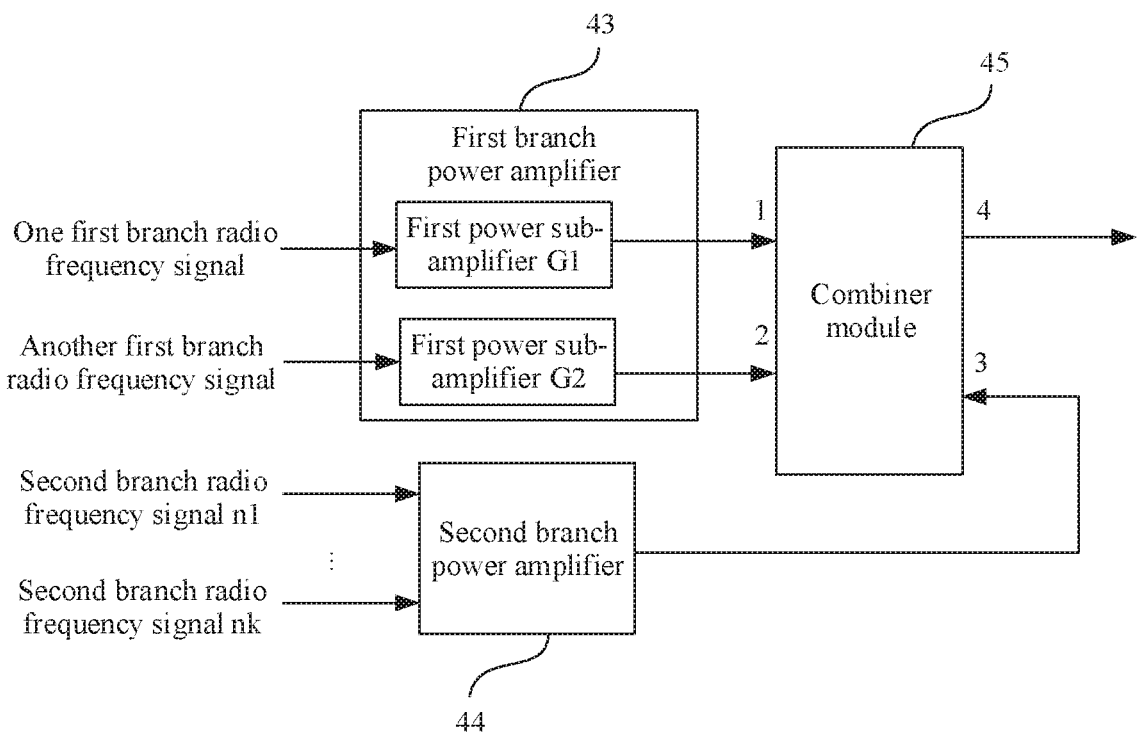
FIG. 22 is a schematic diagram of a manner of connecting to a combiner module according to yet another embodiment of this application.
Figure 23:
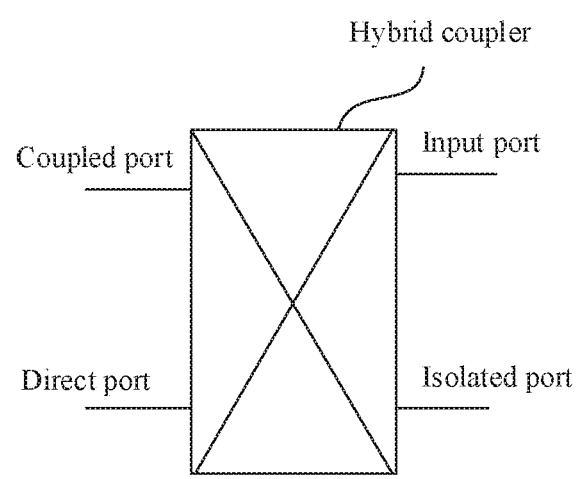
FIG. 23 is a schematic structural diagram of a hybrid coupler according to an embodiment of this application.

In addition, a combiner module 45 may alternatively be a four-port device, and the four-port device may be a rat-race coupler or a hybrid coupler. Referring to FIG. 22, a first branch power amplifier 43 includes a first output port and a second output port, and a second branch power amplifier 44 includes an output port.

The first output port of the first branch power amplifier 43 is connected to a first port (port 1) of the four-port device; the second output port of the first branch power amplifier 43 is connected to a second port (port 2) of the four-port device; and the output port of the second branch power amplifier 44 is connected to a third port (port 3) of the four-port device.

The first branch power amplifier 43 is specifically configured to: receive at least two first branch radio frequency signals; and amplify the received at least two first branch radio frequency signals, and output the at least two amplified first branch radio frequency signals to the first port and the second port of the four-port device. As shown in FIG. 22, for example, the first branch power amplifier 43 includes a first power sub-amplifier G1 and a first power sub-amplifier G2. One first branch radio frequency signal is amplified and output by the first power sub-amplifier G1, and another first branch radio frequency signal is amplified and output by the first power sub-amplifier G2. The second branch power amplifier 44 is specifically configured to: amplify the received at least one second branch radio frequency signal (n1-nk), and output the amplified at least one second branch radio frequency signal (n1-nk) to the third port of the four-port device. The four-port device is configured to: adjust, based on the signal received through the third port, the signal received through the first port and the signal received through the second port; and combine the adjusted signal received through the first port and the adjusted signal received through the second port, and output a combined signal to a fourth port (port 4) of the four-port device. Optionally, when the first branch power amplifier includes more power sub-amplifiers, or amplifies two or more radio frequency signals, the first branch power amplifier may further combine some or all of a plurality of amplified radio frequency signals to obtain two radio frequency signals, and respectively output the two radio frequency signals to the second port and the third port of the four-port device. Optionally, when the second branch power amplifier includes more than one power sub-amplifier, or amplifies more than one radio frequency signal, the second branch power amplifier may further combine the more than one amplified radio frequency signal to obtain one combined radio frequency signal, and output the combined radio frequency signal to the third port of the four-port device.

When the four-port device uses a hybrid coupler, an amplitude of a first output signal output by the first power sub-amplifier G1 is the same as an amplitude of a second output signal output by the first power sub-amplifier G2, and a phase difference is 90 degrees. An output port of the first power sub-amplifier G1 and an output port of the first power sub-amplifier G2 are respectively connected to a coupled port and a direct port of the hybrid coupler. The first output signal and the second output signal are combined and then are output from an input port. An isolated port has no signal output. A combined signal output by the second branch power amplifier 44 is input from an isolated port, and is split into two signals with a same amplitude and a phase difference of 90 degrees. The combined signal is output from the coupled port and the direct port, and the input port has no output. Therefore, (approximate) unidirectional transmission from the isolated port to the coupled port and the direct port and (approximate) unidirectional transmission from the coupled port and the direct port to the isolated port are implemented. In this way, the first output signal and the second output signal that are input at the coupled port and the direct port are separately adjusted by using the two signals obtained by splitting the combined signal that is input at the isolated port. The adjusted first output signal and the adjusted second output signal are combined and then are output by using the input por of the hybrid coupler.

Figure 24:
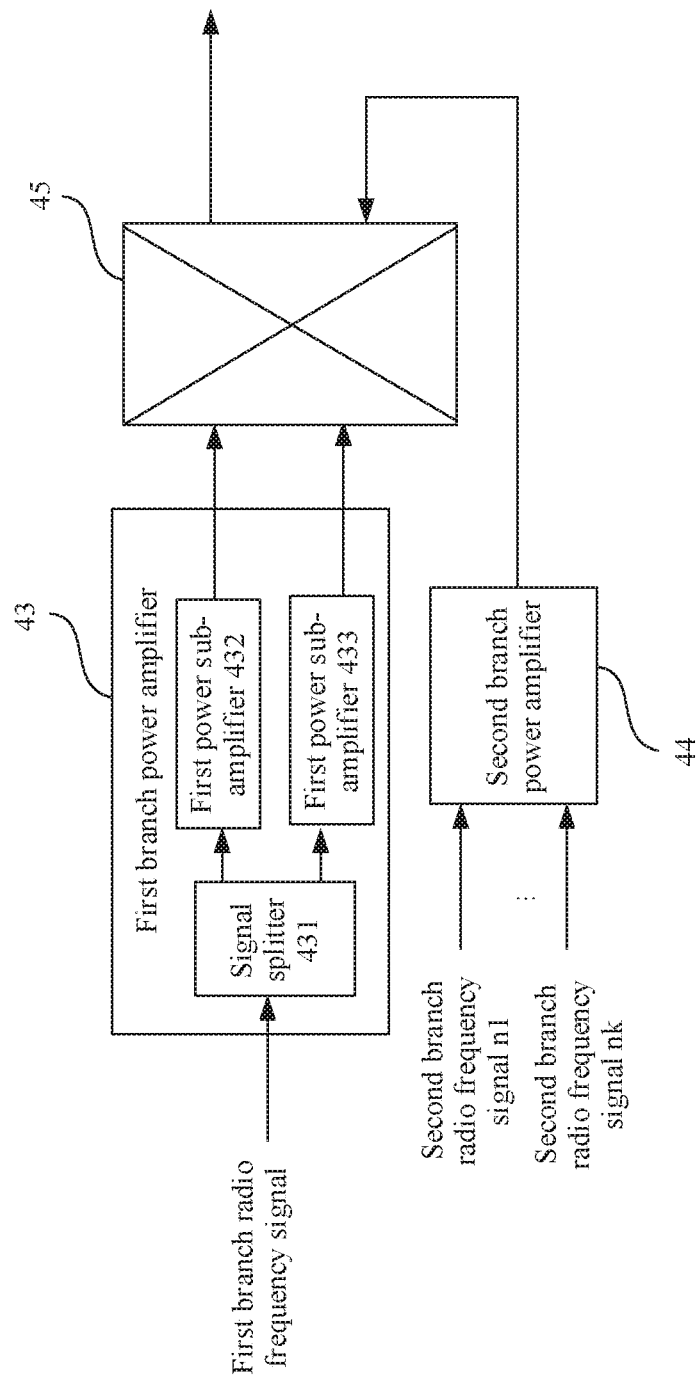
FIG. 24 is a schematic diagram of a manner of connecting to a combiner module according to still yet another embodiment of this application.

In addition, when the combiner module 45 uses a four-port device, referring to FIG. 24, if a first branch power amplifier 43 receives only one first branch radio frequency signal, the first branch power amplifier 43 includes a signal splitter 431, a first power sub-amplifier 432, and a first power sub-amplifier 433. A radio frequency signal conversion module 42 connected to an input port of the signal splitter 431 receives one first branch radio frequency signal. A first output port of the signal splitter 431 is connected to an input port of the first power sub-amplifier 432, and an output port of the first power sub-amplifier 432 is connected to a first port of the four-port device. A second output port of the signal splitter 431 is connected to an input port of the first power sub-amplifier 433, and an output port of the first power sub-amplifier 432 is connected to a first port of the four-port device. The signal splitter 431 is configured to: split the first branch radio frequency signal into at least two radio frequency signals, and separately input the at least two radio frequency signals to the first power sub-amplifier 432 and the first power sub-amplifier 433. An output port of the second branch power amplifier 44 is connected to a third port of the four-port device, and is specifically configured to amplify received at least one second branch radio frequency signal, combine the amplified signal, and output a combined signal to the third port of the four-port device. The four-port device is configured to: adjust, based on the signal received through the third port, the signal received through the first port and the signal received through the second port: and combine the adjusted signal received through the first port and the adjusted signal received through the second port, and output a combined signal to a fourth port of the four-port device. The signal splitter 431 may use a hybrid coupler.

Although this application is described with reference to the embodiments, in a process of implementing this application that claims protection, a person skilled in the art may understand and implement another variation of the disclosed embodiments by viewing the accompanying drawings, disclosed content, and the accompanying claims. In the claims, "comprising" does not exclude another component or another step, and "a" or "one" does not exclude a meaning of plurality. A single processor or another unit may implement several functions enumerated in the claims. Some measures are recorded in dependent claims that are different from each other, but this does not mean that these measures cannot be combined to produce a better effect. The units or modules described as separate parts may or may not be physically separate. For example, the branch power amplifier, the signal splitter, the combiner module (the three-port device or the four-port device), and the like described above may be physically integrated into one chip or circuit for implementation.

The foregoing descriptions are merely specific implementations of this application, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A signal processing circuit, comprising a splitter, a radio frequency signal converter, a first branch power amplifier, a second branch power amplifier, and a combiner, wherein the splitter is directly connected to the radio frequency signal converter, the radio frequency signal converter is directly connected to the first branch power amplifier and the second branch power amplifier, and the first branch power amplifier and the second branch power amplifier are directly connected to the combiner, wherein at least one of the first branch power amplifier or the second branch power amplifier comprises a Doherty power amplifier;
    the splitter is configured to:
        receive a first digital signal, split the first digital signal into at least one first branch digital signal and at least one second branch digital signal based on an input power of the first digital signal, and
        output the at least one first branch digital signal and the at least one second branch digital signal to the radio frequency signal converter, wherein at least one of a ratio of an amplitude of the at least one first branch digital signal to an amplitude of the at least one second branch digital signal, or a phase difference between the at least one first branch digital signal and the at least one second branch digital signal varies with the input power of the first digital signal;
    the radio frequency signal converter is configured to:
        convert the at least one first branch digital signal and the at least one second branch digital signal into at least one first branch radio frequency signal and at least one second branch radio frequency signal, and
        output the at least one first branch radio frequency signal and the at least one second branch radio frequency signal;
    the first branch power amplifier is configured to: amplify the received at least one first branch radio frequency signal, and output the amplified at least one first branch radio frequency signal to the combiner;
    the second branch power amplifier is configured to:
        amplify the received at least one second branch radio frequency signal, and
        output the amplified at least one second branch radio frequency signal to the combiner; and
    the combiner is configured to:
        receive at least one output signal output by the first branch power amplifier and at least one output signal output by the second branch power amplifier, adjust, based on the at least one output signal output by the second branch power amplifier, the at least one output signal output by the first branch power amplifier, and
        output the adjusted at least one output signal.

2. The signal processing circuit according to claim 1, wherein the first branch power amplifier comprises a first signal splitter connected to at least two first power sub-amplifiers,
    the first signal splitter comprises an input port connected to the radio frequency signal converter, and is configured to:
        receive one of the at least one first branch radio frequency signal, wherein at least two output ports of the first signal splitter are connected to one of the at least two first power sub-amplifier;
        split the first branch radio frequency signal into at least two radio frequency signals; and
        output the at least two radio frequency signals.

3. The signal processing circuit according to claim 1, wherein the second branch power amplifier comprises a second signal splitter connected to at least two second power sub-amplifiers;
    the second signal splitter comprises an input port connected to the radio frequency signal converter, and is configured to:
        receive one of the at least one second branch radio frequency signal, wherein at least two output ports of the second signal splitter are connected to one of the at least two second power sub-amplifier; split one second branch radio frequency signal into at least two radio frequency signals; and
        output the at least two radio frequency signals.

4. The signal processing circuit according to claim 1, wherein the first branch power amplifier comprises at least one first power sub-amplifier, the at least one first power sub-amplifier each comprises an input port connected to the radio frequency signal converter, and are configured to receive one first branch radio frequency signal.

5. The signal processing circuit according to claim 1, wherein the second branch power amplifier comprises at least one second power sub-amplifier, the at least one second power sub-amplifier each comprises an input port connected to the radio frequency signal converter, and are configured to receive one second branch radio frequency signal.

6. The signal processing circuit according to claim 1, wherein the combiner comprises a three-port device, the first branch power amplifier comprises one output port, and the second branch power amplifier comprises one output port;
a first port of the three-port device is connected to the output port of the first branch power amplifier, and the first branch power amplifier is configured to:
amplify the received at least one first branch radio frequency signal, and
output the amplified at least one first branch radio frequency signal to the first port of the three-port device;
a third port of the three-port device is connected to the output port of the second branch power amplifier, and the second branch power amplifier is configured to:
amplify the received at least one second branch radio frequency signal, and
output the amplified at least one second branch radio frequency signal to the third port of the three-port device; and
the three-port device is configured to:
adjust, based on the signal received through the third port, the signal received through the first port, and
output the signal through a second port of the three-port device.

7. The signal processing circuit according to claim 6, wherein the three-port device comprises a circulator.

8. The signal processing circuit according to claim 6, wherein the three-port device comprises a first isolator and a second isolator;
an input port of the first isolator is connected to the first port of the three-port device, and an output port of the first isolator is connected to the second port of the three-port device;
an input port of the second isolator is connected to the third port of the three-port device, and an output port of the second isolator is connected to the first port of the three-port device;
the second isolator is configured to transmit the signal received through the third port of the three-port device to the input port of the first isolator; and
the first isolator is configured to adjust, based on the signal received through the third port of the three-port device, the signal received through the first port of the three-port device, and output the signal through the second port of the three-port device.

9. The signal processing circuit according to claim 1, wherein
the combiner comprises a four-port device; the first branch power amplifier comprises a first output port and a second output port; and the second branch power amplifier comprises one output port;
the first output port of the first branch power amplifier is connected to a first port of the four-port device; the second output port of the first branch power amplifier is connected to a second port of the four-port device; and the output port of the second branch power amplifier is connected to a third port of the four-port device;
the first branch power amplifier is configured to:
receive at least two first branch radio frequency signals; and amplify the received at least two first branch radio frequency signals, and
separately output the at least two amplified first branch radio frequency signals to the first port and the second port of the four-port device;
the second branch power amplifier is configured to:
amplify the received at least one second branch radio frequency signal, and
output the amplified at least one second branch radio frequency signal to the third port of the four-port device; and
the four-port device is configured to:
adjust, based on the signal received through the third port, the signal received through the first port and the signal received through the second port,
combine the adjusted signal received through the first port and the adjusted signal received through the second port, and
output a combined signal to a fourth port of the four-port device.

10. The signal processing circuit according to claim 9, wherein the four-port device comprises at least one of a rat-race coupler and a hybrid coupler.

11. The signal processing circuit according to claim 1, wherein the first branch power amplifier belongs to at least one of the following power amplifier types: a single-tube power amplifier, a Doherty power amplifier, a Chireix power amplifier, an outphasing power amplifier, or an envelope tracking (ET) power amplifier.

12. The signal processing circuit according to claim 1, wherein the second branch power amplifier belongs to at least one of the following power amplifier types: a single-tube power amplifier, a Doherty power amplifier, a Chireix power amplifier, an outphasing power amplifier, or an ET power amplifier.

13. The signal processing circuit according to claim 1, wherein the signal processing circuit is comprised in a radio frequency signal transmitter.

14. The signal processing circuit according to claim 13, wherein the radio frequency signal transmitter is comprised in a communications device.

* * * * *